(12) United States Patent
Komatsu et al.

(10) Patent No.: US 11,417,823 B2
(45) Date of Patent: Aug. 16, 2022

(54) SENSOR ELEMENT, SENSOR DEVICE, FORCE DETECTION APPARATUS, AND ROBOT

(71) Applicant: Seiko Epson Corporation, Tokyo (JP)

(72) Inventors: Hiroshi Komatsu, Shimosuwa (JP); Hiroki Kawai, Matsumoto (JP); Mitsuhiro Tateyama, Minowa (JP)

(73) Assignee: Seiko Epson Corporation

( * ) Notice: Subject to any disclaimer, the term of this patent is extended or adjusted under 35 U.S.C. 154(b) by 753 days.

(21) Appl. No.: 16/365,760

(22) Filed: Mar. 27, 2019

(65) Prior Publication Data
US 2019/0305207 A1 Oct. 3, 2019

(30) Foreign Application Priority Data

Mar. 28, 2018 (JP) .............................. JP2018-061415

(51) Int. Cl.
*H01L 41/047* (2006.01)
*H01L 41/08* (2006.01)
*H01L 41/113* (2006.01)
*H01L 41/083* (2006.01)

(52) U.S. Cl.
CPC .......... *H01L 41/047* (2013.01); *H01L 41/083* (2013.01); *H01L 41/1132* (2013.01)

(58) Field of Classification Search
CPC . H01L 41/047; H01L 41/083; H01L 41/1132; H01L 41/0472

USPC ................................ 310/328, 365, 366, 348
See application file for complete search history.

(56) References Cited

U.S. PATENT DOCUMENTS

| | | | | |
|---|---|---|---|---|
| 5,381,385 | A | * 1/1995 | Greenstein | .............. B06B 1/064 |
| | | | | 310/334 |
| 2003/0015942 | A1 | * 1/2003 | Takeshima | .............. H04R 17/00 |
| | | | | 310/348 |
| 2013/0112010 | A1 | 5/2013 | Matsumoto et al. | |

FOREIGN PATENT DOCUMENTS

| | | |
|---|---|---|
| JP | 2013-101020 A | 5/2013 |
| JP | 2015-087333 A | 5/2015 |

* cited by examiner

*Primary Examiner* — Derek J Rosenau
(74) *Attorney, Agent, or Firm* — Harness, Dickey & Pierce, P.L.C.

(57) ABSTRACT

A sensor element includes a first reference potential side terminal located between a first signal side terminal and a second signal side terminal along a first axis passing through the first signal side terminal and the second signal side terminal in a plan view from a direction in which a first piezoelectric element and a second piezoelectric element are stacked and a second reference potential side terminal located between the first signal side terminal and the second signal side terminal along the first axis in the plan view from the direction. The first axis is located between the first reference potential side terminal and the second reference potential side terminal in the plain view from the direction.

9 Claims, 18 Drawing Sheets

FIG. 5
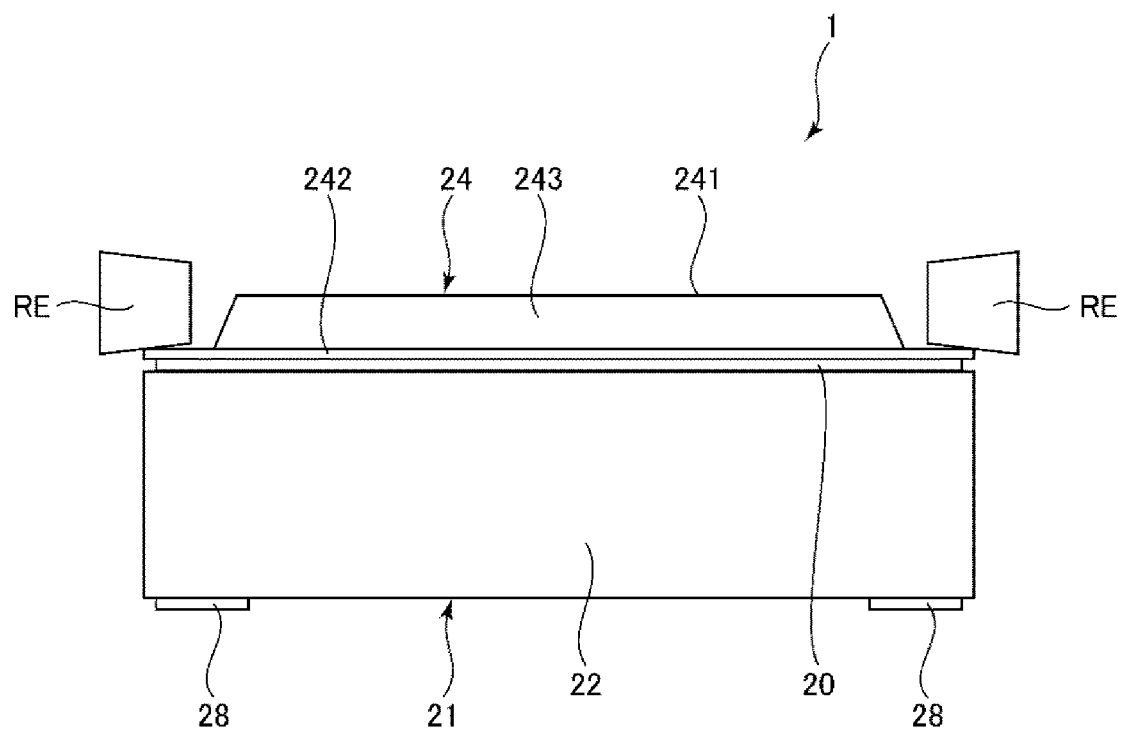
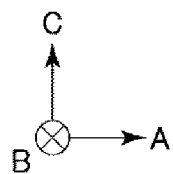

FIG. 18
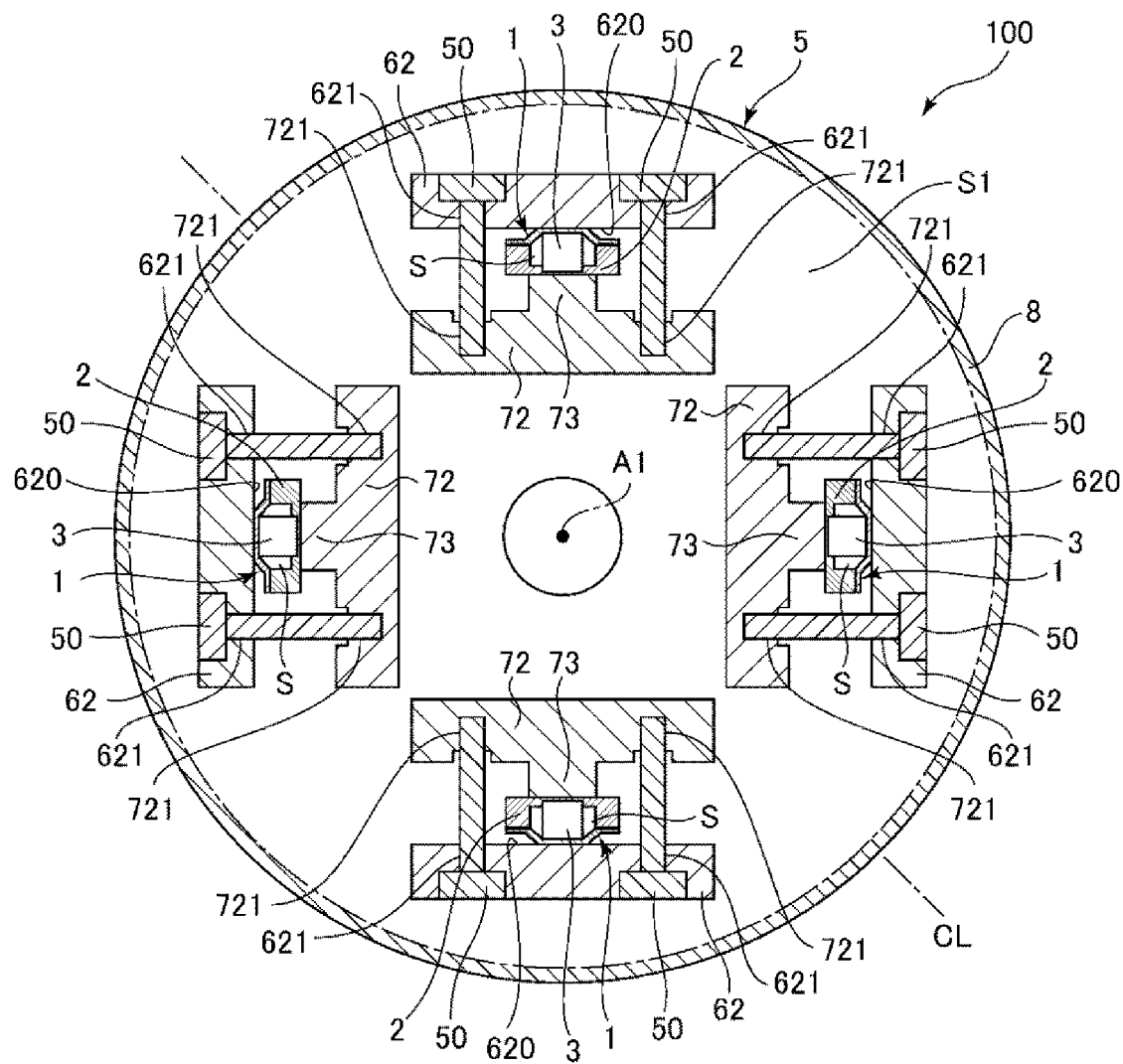
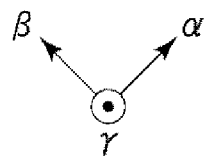

SENSOR ELEMENT, SENSOR DEVICE, FORCE DETECTION APPARATUS, AND ROBOT

BACKGROUND

1. Technical Field

The present invention relates to a sensor element, sensor device, force detection apparatus, and robot.

2. Related Art

Recently, piezoelectric elements each having a structure in which electrodes are provided between a plurality of piezoelectric materials and outputting electric charge according to an applied external force have been known as sensor elements for force detection (for example, see Patent Document 1 (JP-A-2015-87333)). In the sensor element, piezoelectric materials having different crystal directions are stacked, and the element may detect external forces in different axis directions. Further, the element uses quartz crystal as the piezoelectric materials and has excellent characteristics including a wider dynamic range, higher rigidity, higher natural frequency, higher withstanding load, etc., and may be widely used for industrial robots.

However, the sensor element disclosed in Patent Document 1 outputs output signals according to external forces from two different axis directions respectively from two side terminals provided on the same side surface of the sensor element. Accordingly, the two side terminals are placed close to each other, and there is a problem that noise is generated in the output signals output from the respective side terminals due to capacitive coupling and electromagnetic coupling between the side terminals.

SUMMARY

A sensor element according to an aspect of the invention includes a stacking structure having surrounding side surfaces in which a plurality of reference potential electrodes, a first piezoelectric element, a first signal electrode placed in a position with the first piezoelectric element between at least one of the plurality of reference potential electrodes and itself and extracting a signal of the first piezoelectric element, a second piezoelectric element, a second signal electrode placed in a position with the second piezoelectric element between at least one of the plurality of reference potential electrodes and itself and extracting a signal of the second piezoelectric element are stacked, a first signal side terminal placed on the side surface and electrically connected to the first signal electrode, a second signal side terminal placed on the side surface and electrically connected to the second signal electrode, a first reference potential side terminal placed on the side surface and electrically connected to at least one of the reference potential electrodes, and a second reference potential side terminal placed on the side surface and electrically connected to at least one of the reference potential electrodes, wherein, in a plan view from a direction of the stacking, the first reference potential side terminal is located between the first signal side terminal and the second signal side terminal on the side surface on one side of a first axis passing through a position of the first signal side terminal and a position of the second signal side terminal, and the second reference potential side terminal is located between the first signal side terminal and the second signal side terminal on the side surface on the other side of the first axis.

In the sensor element according to the aspect of the invention, it is preferable that the first signal side terminal and the second signal side terminal are placed point-symmetrically with respect to a geometrical center of the sensor element in the plan view, and the first reference potential side terminal and the second reference potential side terminal are placed point-symmetrically with respect to the geometrical center of the sensor element in the plan view.

In the sensor element according to the aspect of the invention, it is preferable that the first piezoelectric element has a first piezoelectric material and a second piezoelectric material having a polarization direction opposite to a polarization direction of the first piezoelectric material, the first signal electrode is placed between the first piezoelectric material and the second piezoelectric material, the first piezoelectric material, the first signal electrode, and the second piezoelectric material are placed between two of the plurality of reference potential electrodes, the second piezoelectric element has a third piezoelectric material and a fourth piezoelectric material having a polarization direction opposite to a polarization direction of the third piezoelectric material, the second signal electrode is placed between the third piezoelectric material and the fourth piezoelectric material, and the third piezoelectric material, the second signal electrode, and the fourth piezoelectric material are placed between two of the plurality of reference potential electrodes.

In the sensor element according to the aspect of the invention, it is preferable that the first piezoelectric element has a plurality of sets of the first piezoelectric material, the second piezoelectric material, and the first signal electrode placed between the first piezoelectric material and the second piezoelectric material, and the second piezoelectric element has a plurality of sets of the third piezoelectric material, the fourth piezoelectric material, and the second signal electrode placed between the third piezoelectric material and the fourth piezoelectric material.

In the sensor element according to the aspect of the invention, it is preferable that the plurality of reference potential electrodes include a first reference potential electrode, a second reference potential electrode, a third reference potential electrode, and a fourth reference potential electrode, the first piezoelectric material is placed between the first reference potential electrode and the first signal electrode, the second piezoelectric material is placed between the second reference potential electrode and the first signal electrode, the third piezoelectric material is placed between the third reference potential electrode and the second signal electrode, the fourth piezoelectric material is placed between the fourth reference potential electrode and the second signal electrode, the first reference potential side terminal is electrically connected to the first reference potential electrode and the second reference potential electrode, the second reference potential side terminal is electrically connected to the third reference potential electrode and the fourth reference potential electrode, the first reference potential side terminal and the third reference potential electrode and the fourth reference potential electrode are electrically insulated, and the second reference potential side terminal and the first reference potential electrode and the second reference potential electrode are electrically insulated.

In the sensor element according to the aspect of the invention, it is preferable that the first piezoelectric material, the second piezoelectric material, the third piezoelectric material, and the fourth piezoelectric material are quartz crystal.

A sensor device according to an aspect of the invention includes the sensor element according to the above described aspect, a base member in which the sensor element is placed, a lid member connected to the base member and forming a housing space for housing the sensor element with the base member, a first circuit containing an electronic component placed on the base member within the housing space and electrically connected to a first signal side terminal and a first reference potential side terminal, and a second circuit containing an electronic component placed on the base member within the housing space and electrically connected to a second signal side terminal and a second reference potential side terminal, wherein the first circuit is placed on one side of the sensor element and the second circuit is placed on the other side of the sensor element in a plan view of the base member.

In the sensor device according to the aspect of the invention, it is preferable that, in the sensor element, the first signal side terminal and the second signal side terminal are placed point-symmetrically with respect to a geometrical center of the sensor element in the plan view, the first reference potential side terminal and the second reference potential side terminal are placed point-symmetrically with respect to the geometrical center, and the first circuit and the second circuit are placed point-symmetrically with respect to the geometrical center.

In the sensor device according to the aspect of the invention, it is preferable that the lid member is connected to the base member having a connecting portion, a wire connecting the first signal side terminal and the electronic component of the first circuit is placed apart from the connecting portion, and a wire connecting the second signal side terminal and the electronic component of the second circuit is placed apart from the connecting portion.

In the sensor device according to the aspect of the invention, it is preferable that the first circuit includes a plurality of the electronic components, the second circuit includes a plurality of the electronic components, and wires connecting between the electronic components contained in the respective first circuit and the second circuit are placed apart from the connecting portion.

A force detection apparatus according to an aspect of the invention includes a first board, a second board, and the sensor device according to the above described aspect placed between the first board and the second board.

A robot according to an aspect of the invention includes a base, an arm connected to the base, and the force detection apparatus according to the above described aspect.

BRIEF DESCRIPTION OF THE DRAWINGS

The invention will be described with reference to the accompanying drawings, wherein like numbers reference like elements.

FIG. 5 is a side view showing a manufacturing method of the sensor device shown in FIG. 1.

FIG. 18 is a cross sectional view of the force detection apparatus shown in FIG. 16.

DESCRIPTION OF EXEMPLARY EMBODIMENTS

As below, a sensor element, sensor device, force detection apparatus, and robot as aspects according to the invention will be explained in detail based on embodiments shown in the accompanying drawings.

First Embodiment

First, a sensor device according to the first embodiment of the invention is explained.

Figure 1:
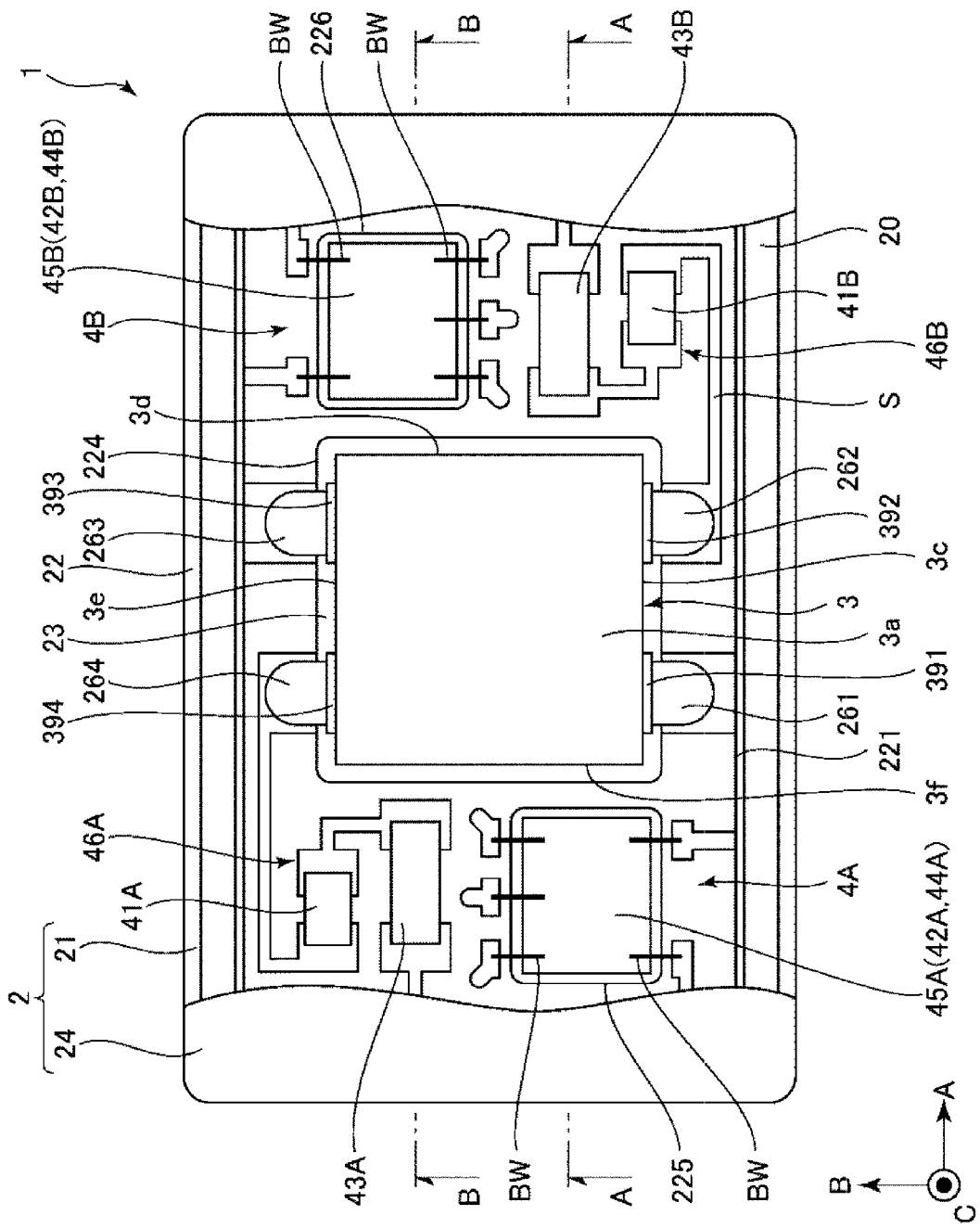
FIG. 1 is a plan view of a sensor device according to a first embodiment of the invention.
Figure 2:
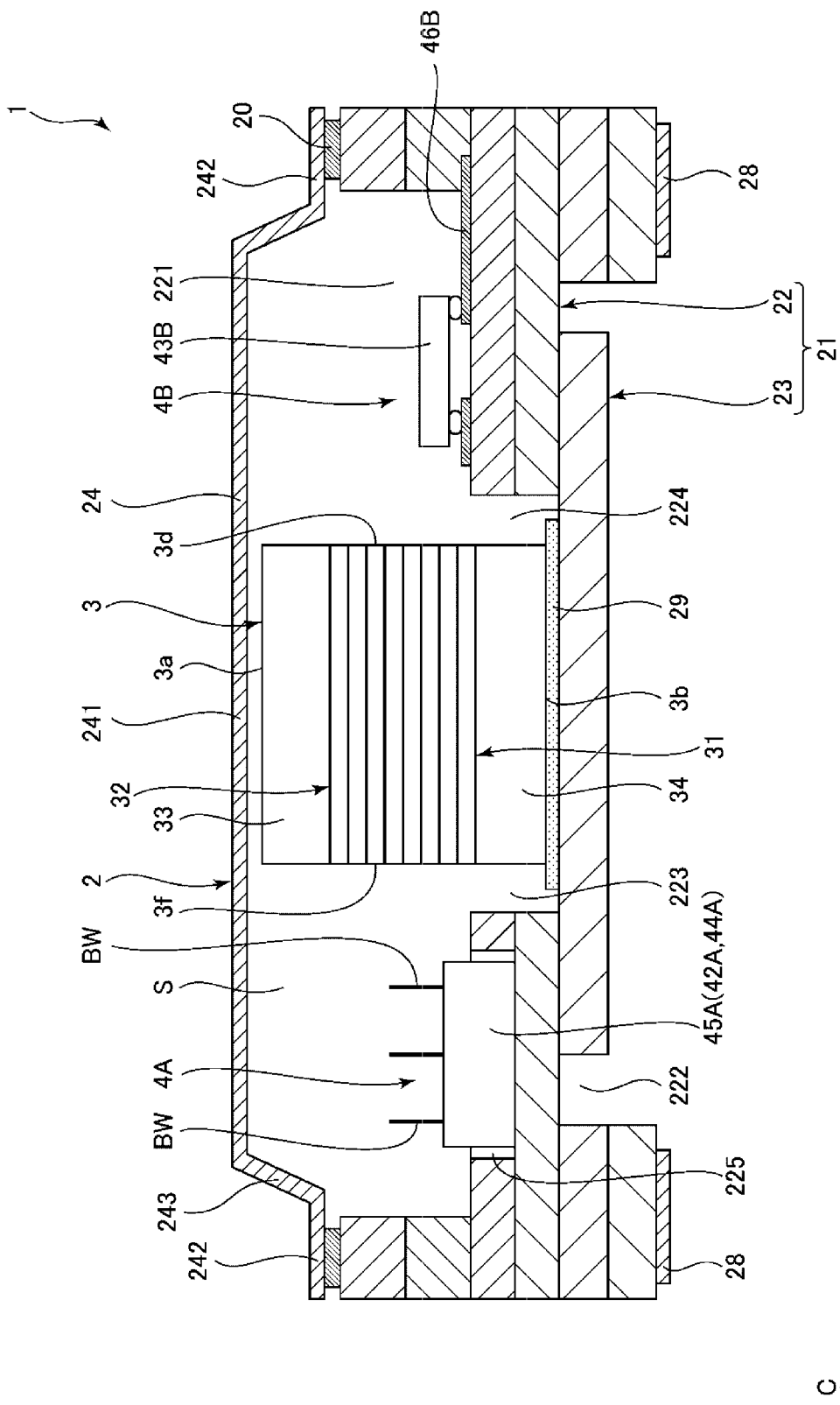
FIG. 2 is a sectional view along line A-A in FIG. 1.
Figure 3:
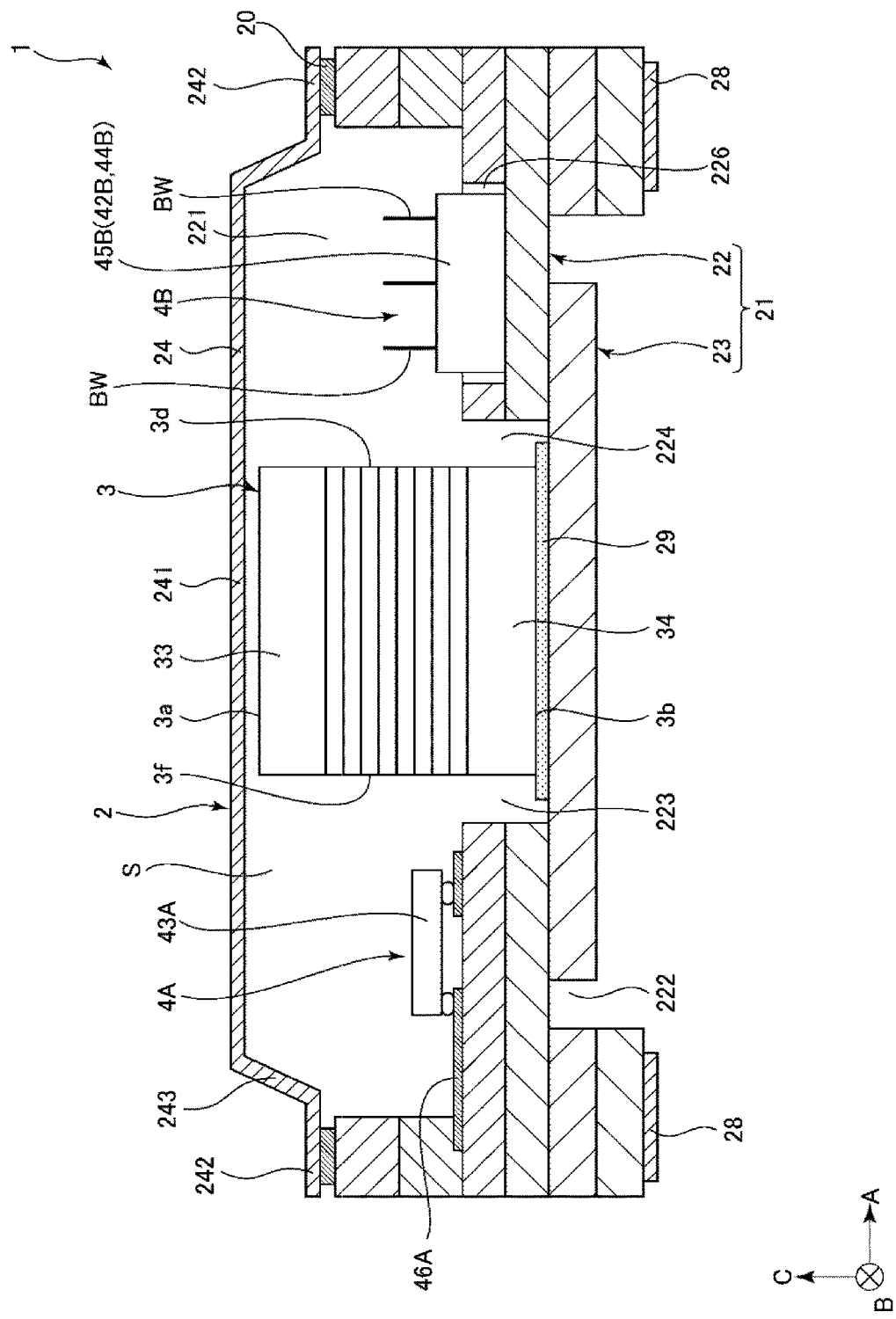
FIG. 3 is a sectional view along line B-B in FIG. 1.
Figure 4:
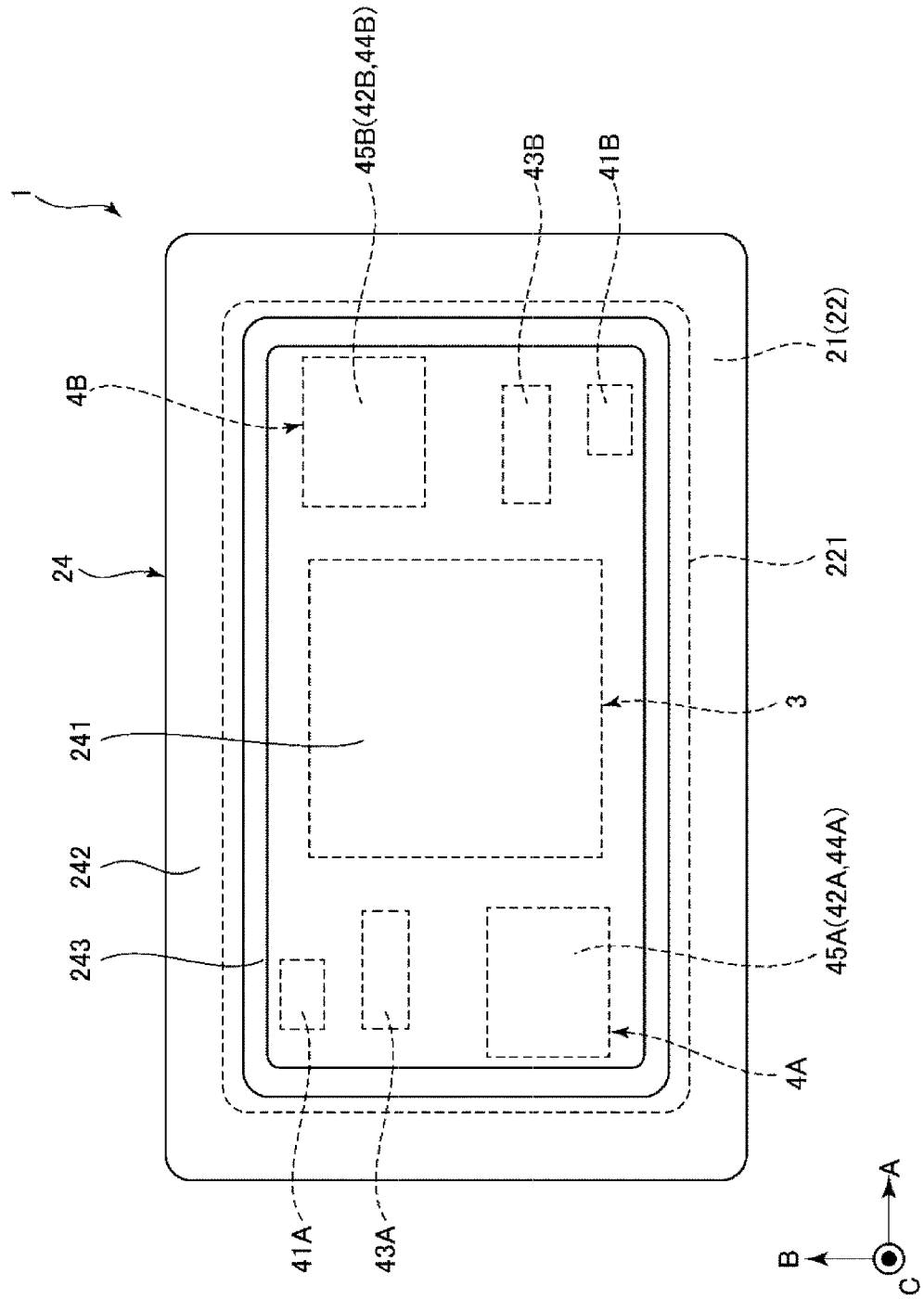
FIG. 4 is a plan view of the sensor device shown in FIG. 1.
Figure 6:
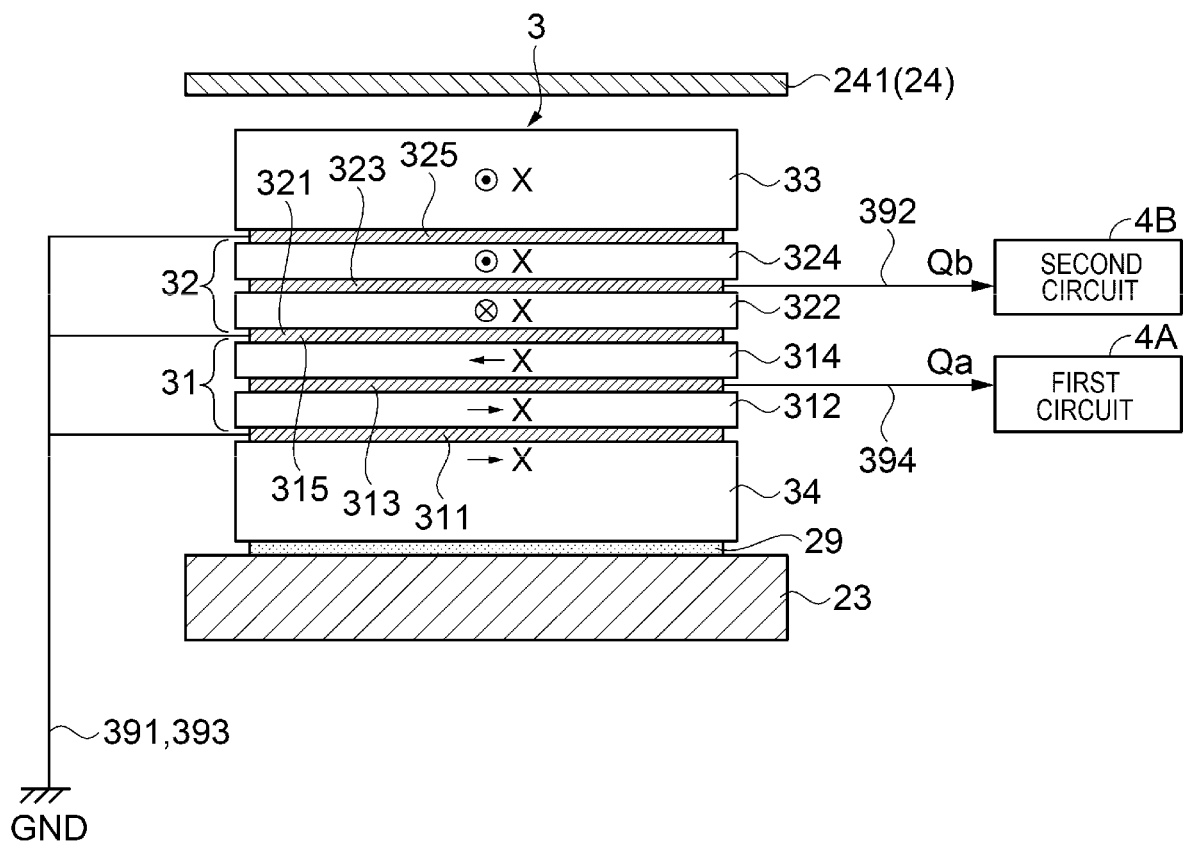
FIG. 6 is a sectional view of a sensor element of the sensor device shown in FIG. 1.
Figure 7:
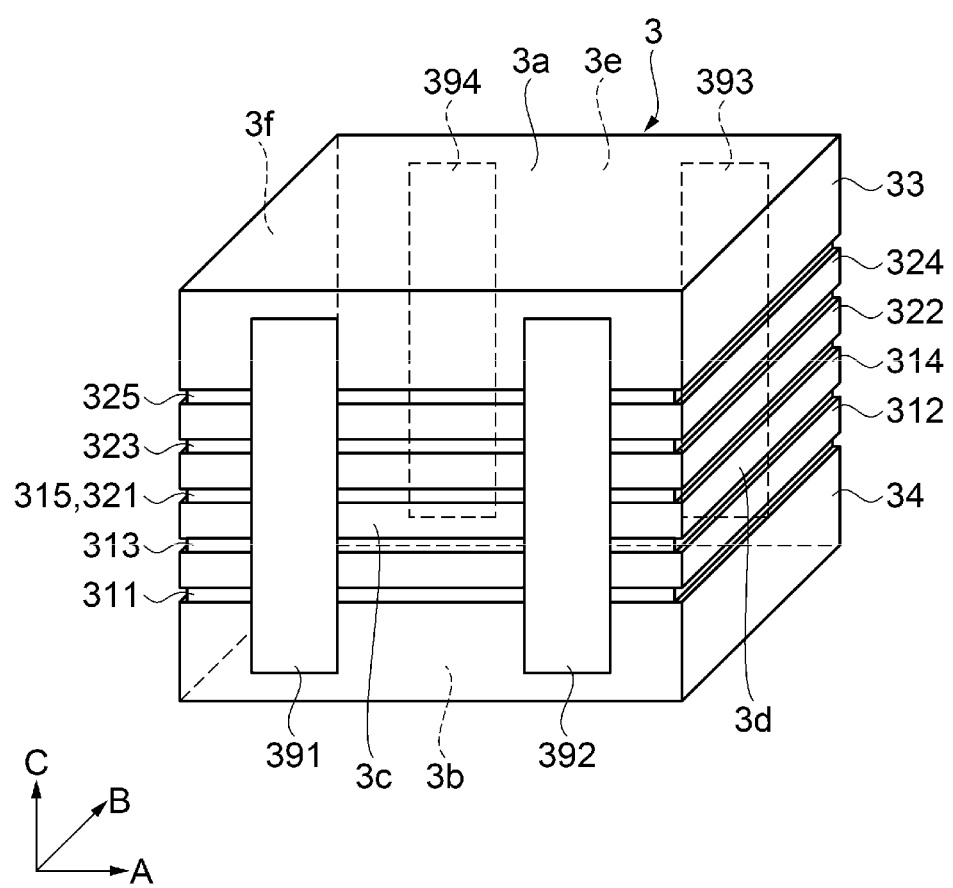
FIG. 7 is a perspective view of the sensor element shown in FIG. 6.
Figure 8:
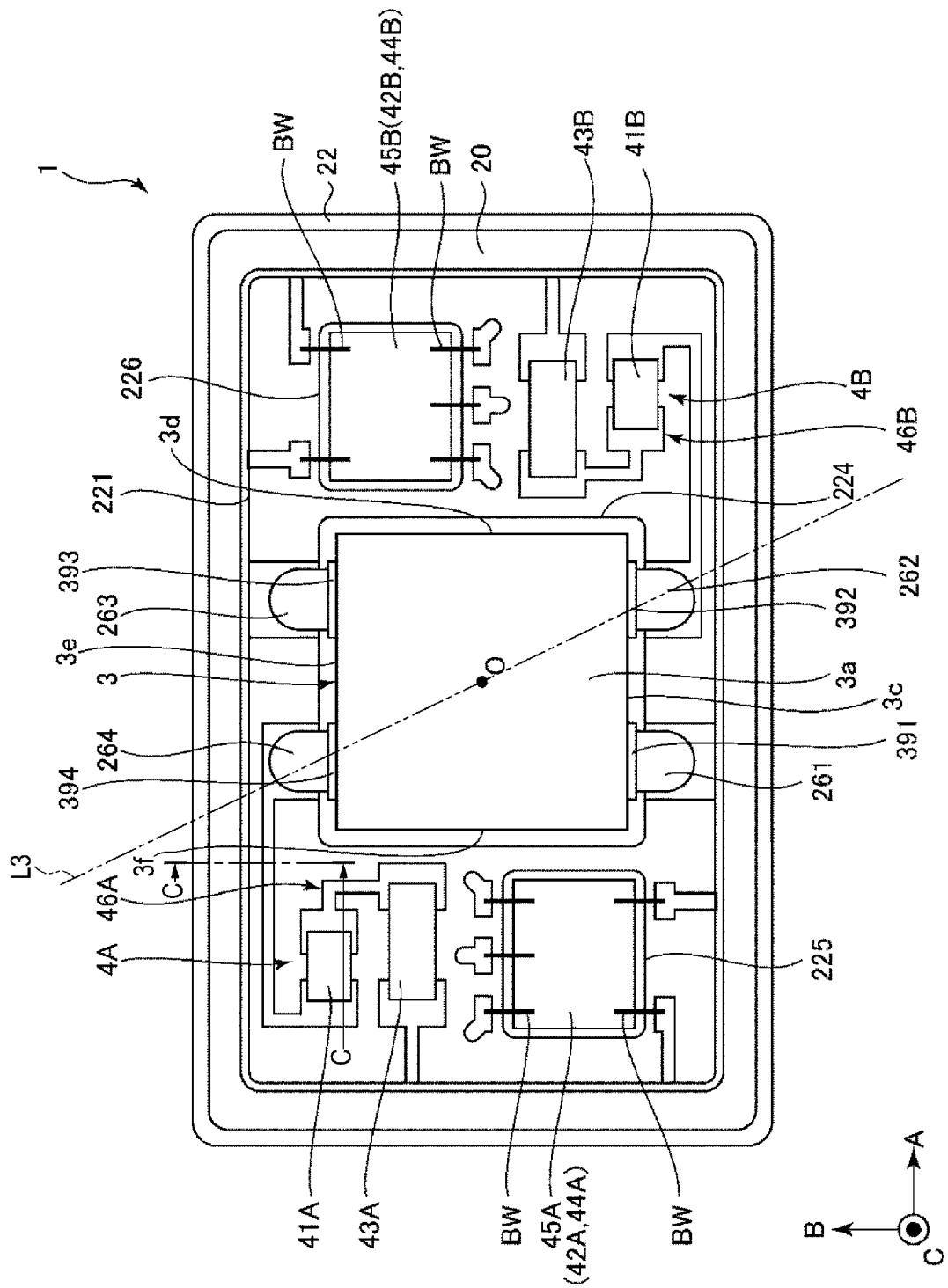
FIG. 8 is a plan view of the sensor device shown in FIG. 1.
Figure 9:
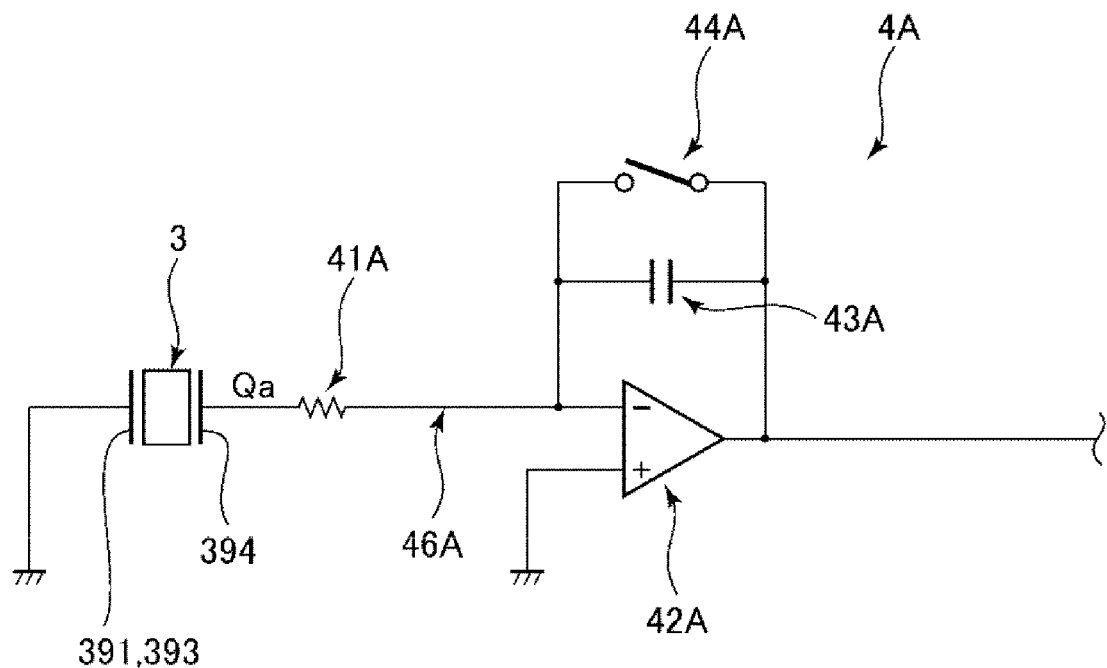
FIG. 9 is a circuit diagram of a first circuit of the sensor device shown in FIG. 1.
Figure 10:
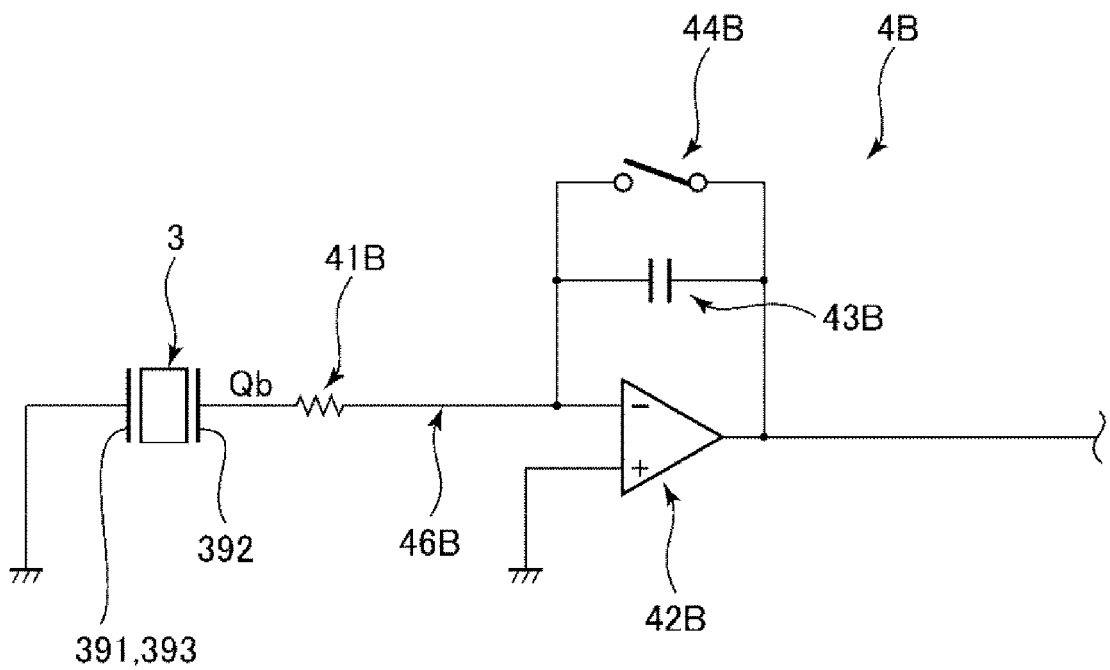
FIG. 10 is a circuit diagram of a second circuit of the sensor device shown in FIG. 1.
Figure 11:
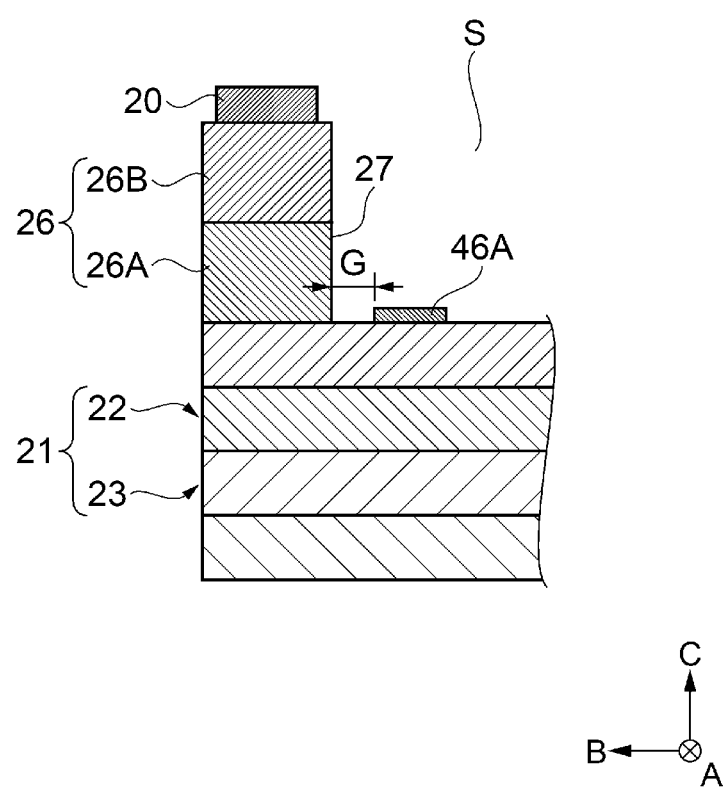
FIG. 11 is a sectional view along line C-C in FIG. 8.

FIG. 1 is a plan view of the sensor device according to the first embodiment of the invention. FIG. 2 is a sectional view along line A-A in FIG. 1. FIG. 3 is a sectional view along line B-B in FIG. 1. FIG. 4 is a plan view of the sensor device shown in FIG. 1. FIG. 5 is a side view showing a manufacturing method of the sensor device shown in FIG. 1. FIG. 6 is a sectional view of a sensor element of the sensor device shown in FIG. 1. FIG. 7 is a perspective view of the sensor element shown in FIG. 6. FIG. 8 is a plan view of the sensor device shown in FIG. 1. FIG. 9 is a circuit diagram of a first circuit of the sensor device shown in FIG. 1. FIG. 10 is a circuit diagram of a second circuit of the sensor device shown in FIG. 1. FIG. 11 is a sectional view along line C-C in FIG. 8.

Hereinafter, for convenience of explanation, three axes orthogonal to one another are referred to as "A-axis", "B-axis, and "C-axis", and the tip end sides of arrows showing the respective axes are referred to as "plus sides" and the tail end sides are referred to as "minus sides". Further, directions parallel to the A-axis are referred to as "A-axis directions (first directions)", directions parallel to the B-axis are referred to as "B-axis directions (second directions)", and directions parallel to the C-axis are referred to as "C-axis directions (third directions)". Furthermore, the plus side in the C-axis direction is also referred to as "upper" and the minus side in the C-axis direction is also referred to as "lower". A view as seen from the C-axis direction (a plan view of a base member 21) is also referred to as "plan view".

The sensor device 1 shown in FIG. 1 has a package 2, a sensor element 3 housed in the package 2, a first circuit 4A, and a second circuit 4B. The sensor device 1 is sandwiched from the C-axis directions and used with the sensor element 3 pressurized, for example, as a force detection apparatus 100, which will be described later. External forces (a shear force in the A-axis direction and a shear force in the B-axis direction) applied to the sensor device 1 are transmitted to the sensor element 3 via the package 2, and signals based on the applied external forces are output from the sensor element 3 and the output signals are processed in the first circuit 4A and the second circuit 4B.

Note that, in the embodiment, as the sensor element 3, a configuration in which a first piezoelectric element 31 and a second piezoelectric element 32, which will be described later, are stacked is exemplified, but the sensor element is not limited to that. A sensor device in which a first element and a second element that output electric charge according to the external forces are respectively independently placed may be employed.

In the plan view, the package 2 is in a nearly rectangular shape having the long axis along the A-axis directions and the short axis along the B-axis directions. The package 2 has the base member 21 and a lid member 24 joined to the base member 21. An air-tight housing space S is formed inside of the package 2, and the sensor element 3, the first circuit 4A, and the second circuit 4B are respectively housed in the housing space S. The sensor element 3, the first circuit 4A, and the second circuit 4B are housed in the package 2, and thereby, these respective parts may be protected (dust-proof, water-proof) from the outside world. Particularly, the first circuit 4A and the second circuit 4B are protected from water (moisture), and thereby, deterioration and variations of the characteristics of the first circuit 4A and the second circuit 4B due to water may be suppressed.

The atmosphere of the housing space S is not particularly limited, but preferably in a vacuum state or a state nearly the vacuum state (reduced-pressure state). Specifically, the housing space S is preferably from 0.01 Pa to 1000 Pa. Thereby, the deterioration and variations of the characteristics of the first circuit 4A and the second circuit 4B may be effectively suppressed. Note that the housing space S may be not only in the vacuum state but also replaced by an inert gas such as nitrogen, argon, or helium.

As shown in FIGS. 2 and 3, the base member 21 has a base part 22 and a bottom member 23. The base part 22 has a concave portion 221 opening in the upper surface, a concave portion 222 opening in the lower surface, and a through hole 223 penetrating the center parts of the bottom surfaces of the concave portions 221, 222. Further, the bottom member 23 has a plate shape and joined to the bottom surface of the concave portion 222 to close the lower opening of the through hole 223. Accordingly, the through hole 223 and the bottom member 23 form a concave portion 224 opening in the center part of the bottom surface of the concave portion 221. The sensor element 3 is placed to be inserted into the concave portion 224, and a lower surface 3$b$ of the sensor element 3 is joined to the upper surface of the bottom member 23 via an adhesive 29.

As shown in FIG. 2, the base part 22 has a concave portion 225 located on the minus side of the concave portion 224 in the A-axis direction and opening in the bottom surface of the concave portion 221. A circuit element 45A of the first circuit 4A is placed in the concave portion 225. Further, as shown in FIG. 3, the base part 22 has a concave portion 226 located on the plus side of the concave portion 224 in the A-axis direction and opening in the bottom surface of the concave portion 221. A circuit element 45B of the second circuit 4B is placed in the concave portion 226. As will be described later, the circuit elements 45A, 45B have larger heights (thicknesses) than the other circuit elements of the first, second circuits 4A, 4B. Accordingly, the concave portions 225, 226 are formed in the base member 21 and the circuit elements 45A, 45B are placed therein, and thereby, the height of the package 2 may be made smaller.

As shown in FIG. 1, a wire 46A of the first circuit 4A and a wire 46B of the second circuit 4B are provided on the base part 22. At least parts of the wires 46A, 46B are respectively placed on the bottom surface of the concave portion 221. Further, as shown in FIGS. 2 and 3, a plurality of external terminals 28 exposed outside of the package 2 and electrically connected to the first circuit 4A and the second circuit 4B are provided on the lower surface of the base part 22.

The constituent material of the base part 22 is preferably a material having an insulation property and e.g. various ceramics including oxide ceramics such as alumina or zirconia, carbide ceramics such as silicon carbide, nitride ceramics such as silicon nitride as a principal component. Thereby, the base part 22 having appropriate rigidity and a good insulation property is obtained. Accordingly, the package 2 is harder to be damaged due to deformation of the package 2 and the sensor element 3, the first circuit 4A, and the second circuit 4B housed inside may be protected more reliably.

The constituent material of the bottom member 23 is not particularly limited to, but includes various metal materials e.g. stainless steel, kovar, copper, iron, carbon steel, titanium, etc. Of the materials, kovar is particularly preferable. Thereby, the bottom member 23 having higher rigidity and appropriately elastically deforming when stress is applied thereto is obtained. Accordingly, an external force may be properly transmitted via the bottom member 23 to the sensor element 3 and likelihood of breakage of the bottom member 23 by the external force may be reduced. Further, kovar has a coefficient of thermal expansion closer to the ceramics as the constituent material of the base part 22, and thermal stress (distortion due to the difference in coefficient of thermal expansion between the base part 22 and the bottom member 23) is harder to be generated in the base member 21 and output drift due to thermal stress may be effectively suppressed.

The lid member 24 has a plate shape and joined to the upper surface of the base part 22 to close the opening formed on the plus side of the concave portion 221 in the C-axis direction via a seal member 20. As shown in FIGS. 2, 3, and 4, the lid member 24 has a center portion 241, an outer edge portion 242 surrounding the center portion 241 and having a frame shape along the outer edge, and a coupling portion 243 located between the center portion 241 and the outer edge portion 242 and coupling these portions. The lid member 24 is joined to the upper surface of the base part 22 via the seal member 20 in the outer edge portion 242. Further, the center portion 241 is located on the opposite side (the plus side in the C-axis direction) to the bottom member 23 with respect to the outer edge portion 242, and the coupling portion 243 is inclined in a tapered shape to connect the outer edge portion 242 and the center portion 241.

As described above, the lid member 24 is formed in a hat shape, and thereby, the height of the outer periphery part of the package 2 may be made smaller and the package 2 may be downsized by the amount of height decrease. The boundary parts between the center portion 241, the coupling portion 243, and the outer edge portion 242 are flexed, and thereby, stress applied to the lid member 24 may be relaxed and absorbed. Accordingly, separation of the lid member 24 may be suppressed. Particularly, as shown in FIG. 5, the lid member 24 is joined to the upper surface of the base part 22 using seam welding, and stress generated by pressing of a roller electrode RE to the outer edge portion 242 and thermal stress generated by heating of the lid member 24 by the roller electrode RE may be effectively relaxed and absorbed by the above described deformation. Therefore, breakage of the lid member 24 may be effectively suppressed, and further, the housing space S may be air-tightly sealed more reliably. Note that the shape of the lid member 24 is not particularly limited, but may be e.g. a flat plate shape or, inversely to the embodiment, the center portion 241 may be recessed.

The constituent material of the lid member 24 is not particularly limited to, but includes various metal materials e.g. stainless steel, kovar, copper, iron, carbon steel, titanium, etc. like the above described bottom member 23. Of the materials, kovar is particularly preferable. Thereby, like the bottom member 23, the external force may be transmitted more correctly by the sensor element 3 and breakage of the lid member 24 by the external force may be reduced. Note that the constituent material of the lid member 24 may be the same as or different from the constituent material of the bottom member 23, but is preferably the same. Thereby, the external force applied to the package 2 may be transmitted more correctly by the sensor element 3.

The sensor element 3 has a function of outputting electric charge Qa (first output signal) according to a component of the external force applied to the sensor element 3 in the A-axis direction and electric charge Qb (second output signal) according to a component of the external force applied to the sensor element 3 in the B-axis direction. As shown in FIG. 6, the sensor element 3 has the first piezoelectric element 31 that outputs the electric charge Qa according to the external force in the A-axis direction (shear force), the second piezoelectric element 32 that outputs the electric charge Qb according to the external force in the B-axis direction (shear force), and a pair of supporting boards 33, 34.

As shown in FIG. 6, the first piezoelectric element 31 has a configuration in which a first reference potential electrode 311, a first piezoelectric material 312, a first signal electrode 313, a second piezoelectric material 314, and a second reference potential electrode 315 are stacked sequentially from the downside (the minus side in the C-axis direction). That is, the first piezoelectric material 312, the first signal electrode 313, and the second piezoelectric material 314 are placed between the two reference potential electrodes 311, 315. Note that the first signal electrode 313 is an electrode for extraction of the signal of the first piezoelectric element 31.

The second piezoelectric element 32 is stacked on the first piezoelectric element 31, and has a configuration in which a third reference potential electrode 321, a third piezoelectric material 322, a second signal electrode 323, a fourth piezoelectric material 324, and a fourth reference potential electrode 325 are stacked sequentially from the downside (the minus side in the C-axis direction). That is, the third piezoelectric material 322, the second signal electrode 323, and the fourth piezoelectric material 324 are placed between the two reference potential electrodes 321, 325. Note that the second signal electrode 323 is an electrode for extraction of the signal of the second piezoelectric element 32.

The sensor element 3 has a stacking structure in which the first piezoelectric element 31 and the second piezoelectric element 32 formed by stacking of the plurality of electrodes and the plurality of piezoelectric materials are stacked. Note that the order of the stacking of the first piezoelectric element 31 and the second piezoelectric element 32 in the C-axis direction may be opposite, or the first piezoelectric element 31 and the second piezoelectric element 32 may be placed side by side, not stacked.

The first piezoelectric material 312, the second piezoelectric material 314, the third piezoelectric material 322, and the fourth piezoelectric material 324 are respectively formed using quartz crystal. Thereby, the sensor element 3 having good characteristics including higher sensitivity, wider dynamic range, and higher rigidity is obtained. In the first piezoelectric material 312, the X-axis (electrical axis) as the crystal axis of the quartz crystal is directed toward the right side (the plus side in the A-axis direction) in FIG. 6 and, in the second piezoelectric material 314, the X-axis of the quartz crystal is directed toward the left side (the minus side in the A-axis direction) in FIG. 6. Accordingly, the second piezoelectric material 314 is polarized in the opposite direction to the polarization direction of the first piezoelectric material 312. Further, in the third piezoelectric material 322, the X-axis of the quartz crystal is directed toward the far side of the paper (the plus side in the B-axis direction) in FIG. 6 and, in the fourth piezoelectric material 324, the X-axis of the quartz crystal is directed toward the near side of the paper (the minus side in the B-axis direction) in FIG. 6. Accordingly, the fourth piezoelectric material 324 is polarized in the opposite direction to the polarization direction of the third piezoelectric material 322. These respective piezoelectric materials 312, 314, 322, 324 are formed using Y cut quartz crystal plates (quartz crystal plates having thicknesses along the Y-axis (mechanical axis) of quartz crystal).

Note that the piezoelectric materials 312, 314, 322, 324 may have configurations using another piezoelectric material than quartz crystal. The other piezoelectric material than quartz crystal includes e.g. topaz, barium titanate, lead titanate, lead zirconate titanate (PZT: Pb (Zr,Ti)O$_3$), lithium niobate, and lithium tantalate.

The reference potential electrodes 311, 315 (321), 325 are respectively electrically connected to the ground potential GND. The first signal electrode 313 is electrically connected to the first circuit 4A, and the second signal electrode 323 is electrically connected to the second circuit 4B. The constituent materials of these reference potential electrodes 311, 315 (321), 325 and signal electrodes 313, 323 are not particularly limited to, but include e.g. nickel, gold, titanium, aluminum, copper, iron, chromium, or an alloy containing the metals. One of the materials may be used or two or more of the materials may be combined (stacked, for example) for use.

The pair of supporting boards 33, 34 are placed to sandwich the stacking structures of the piezoelectric elements 31, 32 from top and bottom. Specifically, the supporting board 33 is placed on an upper surface 3a of the stacking structure of the piezoelectric elements 31, 32 and the supporting board 34 is placed on the lower surface 3b. Thereby, the reference potential electrodes 311, 325 may be covered by the supporting boards 33, 34, and the reference potential electrodes 311, 325 may be protected and unintended conduction because of contact between the reference potential electrodes 311, 325 and the package 2 may be suppressed.

The supporting boards 33, 34 are formed using quartz crystal. The supporting board 33 has the same configuration as the adjacent fourth piezoelectric material 324. That is, the supporting board 33 is formed using a Y cut quartz crystal plate and the X-axis of the quartz crystal is directed toward the near side of the paper (the minus side in the B-axis direction) in FIG. 6 like the fourth piezoelectric material 324. Similarly, the supporting board 34 has the same configuration as the adjacent first piezoelectric material 312. That is, the supporting board 34 is formed using a Y cut quartz crystal plate and the X-axis of the quartz crystal is directed toward the right side (the plus side in the A-axis direction) in FIG. 6 like the first piezoelectric material 312. As described above, the supporting board 33 has the same configuration as the adjacent fourth piezoelectric material 324 and the supporting board 34 has the same configuration as the adjacent first piezoelectric material 312, and thereby, the coefficients of thermal expansion of these may be the same and output drift due to thermal expansion may be effectively reduced.

Note that the crystal axis of the supporting board 33 is not necessarily aligned with the crystal axis of the fourth piezoelectric material 324, and the crystal axis of the supporting board 34 is not necessarily aligned with the crystal axis of the first piezoelectric material 312. Or, the supporting boards 33, 34 may be respectively formed using other piezoelectric materials than piezoelectric materials, or using other materials without conductivity than quartz crystal. Or, the supporting boards 33, 34 may be omitted.

As shown in FIG. 7, the overall shape of the sensor element 3 is a rectangular parallelepiped shape. That is, the sensor element 3 has the upper surface 3*a* as an upper surface of the supporting board 33, the lower surface 3*b* as a lower surface of the supporting board 34, and four side surfaces 3*c*, 3*d*, 3*e*, 3*f* connecting these upper surface 3*a* and lower surface 3*b*. Further, on the side surface 3*c* facing the minus side in the B-axis direction, a first reference potential side terminal 391 electrically connected to the respective reference potential electrodes 311, 315 (321), 325 and a second signal side terminal 392 electrically connected to the second signal electrode 323 are provided apart in the width direction (A-axis direction). Note that, in the embodiment, the first reference potential side terminal 391 is located on the minus side in the A-axis direction and the second signal side terminal 392 is located on the plus side in the A-axis direction.

On the side surface 3*e* opposed to the side surface 3*c* and facing the plus side in the B-axis direction, a second reference potential side terminal 393 electrically connected to the respective reference potential electrodes 311, 315 (321), 325 and a first signal side terminal 394 electrically connected to the first signal electrode 313 are provided apart in the width direction (A-axis direction). Note that, in the embodiment, the first signal side terminal 394 is located on the minus side in the A-axis direction and the second reference potential side terminal 392 is located on the plus side in the A-axis direction.

That is, as shown in FIG. 8, the first reference potential side terminal 391 is located between the first signal side terminal 394 and the second signal side terminal 392 on the side surfaces 3*c*, 3*f* on one side (the minus side in the A-axis direction) of a first axis L3 passing through the position of the first signal side terminal 394 and the position of the second signal side terminal 392 in the plan view from the direction in which the piezoelectric elements 31, 32 are stacked. Further, the second reference potential side terminal 393 is located between the first signal side terminal 394 and the second signal side terminal 392 on the side surfaces 3*d*, 3*e* on the other side (the plus side in the A-axis direction) of the first axis L3. Note that, in FIG. 8, the first axis L3 passes through the center (geometrical center) O of the sensor element 3 in the plan view, however, does not necessarily pass through the center O as long as the axis passes through the position of the first signal side terminal 394 and the position of the second signal side terminal 392.

As described above, the first reference potential side terminal 391 and the second reference potential side terminal 393 electrically connected to the ground potential GND are placed between the first signal side terminal 394 and the second signal side terminal 392. Accordingly, the distance between the two signal side terminals 392, 394 may be made wider, noise generated due to capacitive coupling and electromagnetic coupling between the signal side terminals 392, 394 may be reduced, and deterioration of the electric charges Qa, Qb (output signals) output according to the external forces due to noise may be reduced.

The first signal side terminal 394 and the second signal side terminal 392 are placed point-symmetrically (rotationally symmetrically by 180°) with respect to the center (geometrical center) O of the sensor element 3 in the plan view, and the first reference potential side terminal 391 and the second reference potential side terminal 393 are placed point-symmetrically with respect to the center O of the sensor element 3 in the plan view. Note that the center O may be the geometrical center O of the sensor element 3 in the plan view in a wide sense and may be the geometrical center of the upper surface 3*a* in a narrow sense.

As described above, the first signal side terminal 394 and the second signal side terminal 392 are placed point-symmetrically with respect to the center O of the sensor element 3 in the plan view, and the first reference potential side terminal 391 and the second reference potential side terminal 393 are placed point-symmetrically with respect to the center O of the sensor element 3 in the plan view. Accordingly, detection characteristics of the first piezoelectric element 31 and the second piezoelectric element 32 may be made nearly equal to each other, the electric charge Qa (first output signal) according to the external force in the A-axis direction (shear force) and the electric charge Qb (second output signal) according to the external force in the B-axis direction (shear force) may be extracted with balance, and the applied external forces may be detected with higher accuracy and output from the first signal side terminal 394 and the second signal side terminal 392.

The respective side terminals 391, 392, 393, 394 are provided on the side surfaces 3*c*, 3*e*, and thereby, the electrical connection between the sensor element 3 and the first circuit 4A and the second circuit 4B may be easily made.

The shape of the sensor element 3 is not particularly limited, but may be any shape including e.g. a circular shape, elliptical shape, triangular shape, quadrangular shape except square (rectangular shape, trapezoidal shape, parallelogram shape, or the like), polygonal shape with five or more vertexes, or odd shape.

As above, the sensor element 3 is explained. As shown in FIGS. 2 and 3, the lower surface 3*b* of the sensor element 3 is joined to the bottom surface of the concave portion 224 (the upper surface of the bottom member 23) of the package 2 via the insulating adhesive 29. The adhesive 29 is not particularly limited, but e.g. acrylic resin, phenol resin, silicone resin, epoxy resin, or the like may be used.

Further, as shown in FIGS. 2 and 3, under natural conditions, the upper surface 3*a* of the sensor element 3 is placed apart to face the center portion 241 of the lid member 24. Thereby, application of unintended stress (other stress than that to be detected) to the sensor element 3 sandwiched between the bottom member 23 and the lid member 24 and production of output drift may be effectively suppressed. Note that the upper surface 3a of the sensor element 3 is not limited to that, but may be in contact with the center portion 241 of the lid member 24. Or, an adhesive (e.g. the same adhesive as the adhesive 29) may be provided between the upper surface 3a of the sensor element 3 and the center portion 241 of the lid member 24, and the sensor element 3 and the lid member 24 may be joined via the adhesive.

As above, the sensor element 3 is explained. In the sensor element 3, as described above, the first reference potential side terminal 391 is located between the first signal side terminal 394 and the second signal side terminal 392 on the side surfaces 3c, 3f on one side (the minus side in the A-axis direction) of the first axis L3 passing through the position of the first signal side terminal 394 and the position of the second signal side terminal 392 in the plan view from the direction in which the piezoelectric elements 31, 32 are stacked. Further, the second reference potential side terminal 393 is located between the first signal side terminal 394 and the second signal side terminal 392 on the side surfaces 3d, 3e on the other side (the plus side in the A-axis direction) of the first axis L3. Accordingly, the first reference potential side terminal 391 and the second reference potential side terminal 393 electrically connected to the ground potential GND are placed between the first signal side terminal 394 and the second signal side terminal 392, and thereby, the distance between the two signal side terminals 392, 394 may be made wider, noise generated due to capacitive coupling and electromagnetic coupling between the signal side terminals 392, 394 may be reduced, and deterioration of the electric charges Qa, Qb (output signals) output according to the external forces due to noise may be reduced.

The first signal side terminal 394 and the second signal side terminal 392 are placed point-symmetrically (rotationally symmetrically by 180°) with respect to the center O of the sensor element 3 in the plan view, and the first reference potential side terminal 391 and the second reference potential side terminal 393 are placed point-symmetrically with respect to the center O of the sensor element 3 in the plan view. Accordingly, the detection characteristics of the first piezoelectric element 31 and the second piezoelectric element 32 may be made nearly equal to each other, the electric charge Qa (first output signal) according to the external force in the A-axis direction (shear force) and the electric charge Qb (second output signal) according to the external force in the B-axis direction (shear force) may be extracted with balance, and the applied external forces may be detected with higher accuracy and output from the first signal side terminal 394 and the second signal side terminal 392.

In the first piezoelectric element 31, the first piezoelectric material 312, the first signal electrode 313, and the second piezoelectric material 314 having the polarization direction opposite to the polarization direction of the first piezoelectric material 312 are placed between the first reference potential electrode 311 and the second reference potential electrode 315. In the second piezoelectric element 32, the third piezoelectric material 322, the second signal electrode 323, and the fourth piezoelectric material 324 having the polarization direction opposite to the polarization direction of the third piezoelectric material 322 are placed between the third reference potential electrode 321 and the fourth reference potential electrode 325. Accordingly, the configurations of the first piezoelectric element 31 and the second piezoelectric element 32 may be simpler and the high-sensitivity sensor element 3 may be obtained.

Further, the first piezoelectric material 312, the second piezoelectric material 314, the third piezoelectric material 322, and the fourth piezoelectric material 324 are respectively formed using quartz crystal. Thereby, the sensor element 3 having good characteristics including higher sensitivity, wider dynamic range, and higher rigidity may be obtained.

Next, the first circuit 4A and the second circuit 4B of the sensor device 1 will be explained.

The first circuit 4A and the second circuit 4B are respectively housed in the housing space S of the package 2. As shown in FIG. 8, in the plan view of the base member 21, the first circuit 4A is located on one side (the minus side in the A-axis direction) with respect to the sensor element 3 and the second circuit 4B is located on the other side (the plus side in the A-axis direction) with respect to the sensor element 3. The first circuit 4A is a circuit that processes the electric charge Qa output from the sensor element 3 and the second circuit 4B is a circuit that processes the electric charge Qb output from the sensor element 3. As described above, the first circuit 4A and the second circuit 4B are placed on the sides opposite to each other via the sensor element 3, and thereby, the circuits may be placed as far away from each other as possible. Accordingly, interferences between the first circuit 4A and the second circuit 4B may be reduced, and noise from the second circuit 4B superimposed on the electric charge Qa or noise from the first circuit 4A superimposed on the electric charge Qb may be effectively suppressed. Thus, tolerance to noise may be improved, and the electric charge Qa may be accurately processed by the first circuit 4A and the electric charge Qb may be accurately processed by the second circuit 4B.

The first circuit 4A is a circuit that converts the electric charge Qa into a voltage Va (charge/voltage conversion circuit) and, as shown in FIG. 9, has a resistor 41A to which the electric charge Qa is input, a capacitor 43A (capacitor part) that changes the electric charge Qa, an operational amplifier 42A (amplifier) that amplifies the voltage by the electric charge Qa, a switching element 44A, and a wire 46A.

Of these circuit elements, the resistor 41A and the capacitor 43A are respectively provided on the bottom surface of the concave portion 221, and the operational amplifier 42A and the switching element 44A are integrated as a circuit element 45A and provided on the bottom surface of the concave portion 225. Further, regarding the resistor 41A, the capacitor 43A, and the circuit element 45A as electronic components, the first signal side terminal 394 of the sensor element 3 and the resistor 41A, the resistor 41A and the capacitor 43A, and the capacitor 43A and the circuit element 45A are respectively electrically connected via the wire 46A. The wire 46A is electrically connected to the first reference potential side terminal 391 and the first signal side terminal 394 of the sensor element 3 via conducting connecting members 261, 264 (e.g. various kinds of metal paste including Ag paste, Cu paste, Au paste). Thereby, the circuit shown in FIG. 9 is realized.

In the embodiment, the resistor 41A and the capacitor 43A are electrically connected to the wire 46A by flip-chip implementation using a conducting bump such as a gold (Au) bump, and the circuit element 45A is electrically connected to the wire 46A via a bonding wire BW. Note that the method of electrically connecting the resistor 41A, the capacitor 43A, and the circuit element 45A and the wire 46 is not particularly limited. Or, the operational amplifier 42A and the switching element 44A may be separately formed.

The second circuit 4B is a circuit that converts the electric charge Qb into a voltage Vb (charge/voltage conversion circuit) and has the same configuration as the above described first circuit 4A. That is, as shown in FIG. 10, the second circuit 4B has a resistor 41B to which the electric charge Qb is input, a capacitor 43B (capacitor part) that charges the electric charge Qb, an operational amplifier 42B (amplifier) that amplifies the voltage by the electric charge Qb, a switching element 44B, and a wire 46B.

Of these circuit elements, the resistor 41B and the capacitor 43B are respectively provided on the bottom surface of the concave portion 221, and the operational amplifier 42B and the switching element 44B are integrated as a circuit element 45B and provided on the bottom surface of the concave portion 226. Further, regarding the resistor 41B, the capacitor 43B, and the circuit element 45B as electronic components, the second signal side terminal 392 of the sensor element 3 and the resistor 41B, the resistor 41B and the capacitor 43B, and the capacitor 43B and the circuit element 45B are respectively electrically connected via the wire 46B. The wire 46B is electrically connected to the second reference potential side terminal 393 and the second signal side terminal 392 of the sensor element 3 via conducting connecting members 262, 263 (e.g. various kinds of metal paste including Ag paste, Cu paste, Au paste). Thereby, the circuit shown in FIG. 10 is realized.

In the embodiment, the resistor 41B and the capacitor 43B are electrically connected to the wire 46B by flip-chip implementation using a conducting bump such as a gold (Au) bump, and the circuit element 45B is electrically connected to the wire 46B via a bonding wire BW. Note that the method of electrically connecting the resistor 41B, the capacitor 43B, and the circuit element 45B and the wire 46B is not particularly limited. Or, the operational amplifier 42B and the switching element 44B may be separately formed.

Here, as shown in FIG. 11, the wire 46A electrically connecting the first signal side terminal 394 and the resistor 41A of the first circuit 4A is placed apart from a connecting portion 26 provided on the base part 22. That is, the wire is placed at a distance of a length G from a side wall 27 of the connecting portion 26, and the length G is equal to or larger than 0.1 mm and preferably equal to or larger than 0.2 mm. Note that the connecting portion 26 includes two boards 26A, 26B in annular shapes without center parts, and the lid member 24 is joined thereto via the seal member 20 and the housing space S for housing the sensor element 3 is formed.

The wire 46A electrically connecting the first signal side terminal 394 and the resistor 41A of the first circuit 4A is placed apart from a connecting portion 26, and thereby, a leak current generated between the wire 46A and the seal member 20 may be minimized and draft characteristics of the sensor device 1 may be improved.

The wire 46B electrically connecting the second signal side terminal 392 and the resistor 41B of the second circuit 4B is placed apart from the connecting portion 26 like the wire 46A, and thereby, a leak current generated between the wire 46B and the seal member 20 may be minimized and the draft characteristics of the sensor device 1 may be improved.

The wires 46A, 46B electrically connecting between the electronic components contained in the respective first circuit 4A and the second circuit 4B are placed apart from the connecting portion 26. That is, the wire 46A electrically connecting the resistor 41A and the capacitor 43A and the wire 46B electrically connecting the resistor 41B and the capacitor 43B are placed apart from the connecting portion 26.

As described above, the wires 46A, 46B are placed apart from the connecting portion 26, and thereby, the leak currents generated between the wires 46A, 46B and the seal member 20 provided on the connecting portion 26 may be minimized and the draft characteristics of the sensor device 1 may be improved.

In the first circuit 4A, the circuit element 45A is thicker than the other electronic components, i.e., the resistor 41A and the capacitor 43A. Accordingly, in the embodiment, the concave portion 225 is formed on the bottom surface of the concave portion 221 and the circuit element 45A is provided on the bottom surface of the concave portion 225. Thereby, the height of the circuit element 45A may be suppressed, and thus, increase of the height of the package 2 may be suppressed and the placement space of the bonding wire BW may be easily secured on the circuit element 45A.

Similarly, in the second circuit 4B, the circuit element 45B is thicker than the other electronic components, i.e., the resistor 41B and the capacitor 43B. Accordingly, in the embodiment, the concave portion 226 is formed on the bottom surface of the concave portion 221 and the circuit element 45B is provided on the bottom surface of the concave portion 226. Thereby, the height of the circuit element 45B may be suppressed, and thus, the increase of the height of the package 2 may be suppressed and the placement space of the bonding wire BW may be easily secured on the circuit element 45B. Note that the concave portions 225, 226 may be omitted and the circuit elements 45A, 45B may be placed on the bottom surface of the concave portion 221.

Further, as shown in FIG. 4, in the first circuit 4A, in the plan view, all of the resistor 41A, the capacitor 43A, and the circuit element 45A are placed to overlap with the center portion 241 of the lid member 24. As described above, the center portion 241 of the lid member 24 is offset toward upside of the other portion (outer edge portion 242). Accordingly, contact between the resistor 41A, the capacitor 43A, and the circuit element 45A and the lid member 24 may be suppressed and breakage and malfunction of the first circuit 4A may be suppressed.

Similarly, in the second circuit 4B, in the plan view, all of the resistor 41B, the capacitor 43B, and the circuit element 45B are placed to overlap with the center portion 241 of the lid member 24. Accordingly, contact between the resistor 41B, the capacitor 43B, and the circuit element 45B and the lid member 24 may be suppressed and breakage and malfunction of the second circuit 4B may be suppressed. Note that the placement is not limited to that, but at least one of the resistors 41A, 41B, the capacitors 43A, 43B, and the circuit elements 45A, 45B may be placed in positions not to overlap with the center portion 241 in the plan view, for example.

The first circuit 4A and the second circuit 4B are housed in the package 2, and thereby, the first circuit 4A and the second circuit 4B may be protected and dust-proofness and water-proofness may be improved. Particularly, the first circuit 4A and the second circuit 4B are protected from water (moisture), and thereby, deterioration of the characteristics of these circuits may be effectively suppressed. For example, the capacitors 43A, 43B are parts that charge the electric charges Qa, Qb from the sensor element 3 and easily affected by the leak current depending on humidity. Further, the offset voltages on the input sides of the operational amplifiers 42A, 42B fluctuate due to humidity. As described above, the first circuit 4A and the second circuit 4B contain the circuit elements easily affected by water (humidity). Accordingly, these first circuit 4A and second circuit 4B are housed in the package 2 to be waterproof, and thereby, deterioration and variations of the circuit characteristics may be effectively suppressed and the electric charges Qa, Qb may be converted into the voltages Va, Vb with higher accuracy. Therefore, according to the sensor device 1, the applied external forces may be detected with higher accuracy.

The first circuit 4A and the second circuit 4B are housed in the package 2, and thereby, for example, compared to the case where the first circuit 4A and the second circuit 4B are placed outside of the package 2, the wire lengths of the wires 46A, 46B may be made shorter. Accordingly, tolerance to noise of the first circuit 4A and the second circuit 4B is improved.

The first circuit 4A and the second circuit 4B are symmetrically placed with respect to the sensor element 3 in the plan view. Specifically, in the embodiment, the first circuit 4A and the second circuit 4B are placed point-symmetrically (rotationally symmetrically by 180°) with respect to the center (geometrical center) O of the sensor element 3. Thereby, the circuit characteristics (wire lengths, environmental influences, etc.), i.e., charge/voltage conversion characteristics of the first circuit 4A and the second circuit 4B may be made nearly equal to each other. Accordingly, the electric charge Qa (first output signal) according to the external force in the A-axis direction (shear force) and the electric charge Qb (second output signal) according to the external force in the B-axis direction (shear force) may be extracted with balance, and the applied external forces may be detected with higher accuracy.

Note that the point-symmetric placement of the first circuit 4A and the second circuit 4B with respect to the center O refers to point-symmetric placement of at least respective circuit elements (resistors 41A, 41B, capacitors 43A, 43B, and circuit elements 45A, 45B) with respect to the center O, and preferably refers to further point-symmetric placement of the wires 46A, 46B with respect to the center O. Further, the point-symmetric placement of the first circuit 4A and the second circuit 4B with respect to the center O includes e.g. errors that may be made in design or manufacture and is not necessarily limited to complete point-symmetric placement. In the plan view, the point-symmetric placement includes not only the case where the point of symmetry of the first circuit 4A and the second circuit 4B coincides with the center O but also the case where the point of symmetry is not at the center O in a range overlapping with the sensor element 3.

The first circuit 4A and the second circuit 4B are placed point-symmetrically with respect to the center O, and accordingly, in the sensor element 3, the first signal side terminal 394 to which the electric charge Qa is output is placed on the side surface 3e facing the plus side in the B-axis direction, and the second signal side terminal 392 to which the electric charge Qb is output is placed on the side surface 3e facing the minus side in the B-axis direction. Further, the connecting member 264 connecting the first circuit 4A and the first signal side terminal 394 is placed on the plus side in the B-axis direction with respect to the sensor element 3, and the connecting member 262 connecting the second circuit 4B and the second signal side terminal 392 is placed on the minus side in the B-axis direction with respect to the sensor element 3. According to the arrangement, the first circuit 4A and the second circuit 4B may be placed point-symmetrically with respect to the center O of the sensor element 3 by the simpler arrangement. Particularly, in the embodiment, the first signal side terminal 394 is placed toward the first circuit 4A side (the minus side in the A-axis direction) of the side surface 3e, and thereby, the length of the wire connecting the first signal side terminal 394 and the resistor 41A may be made shorter. Similarly, the second signal side terminal 392 is placed toward the second circuit 4B side (the plus side in the A-axis direction) of the side surface 3c, and thereby, the length of the wire connecting the second signal side terminal 392 and the resistor 41B may be made shorter.

As above, the sensor device 1 is explained. In the sensor device 1, as described above, in the plan view of the base member 21, the first circuit 4A is located on one side (the minus side in the A-axis direction) with respect to the sensor element 3 and the second circuit 4B is located on the other side (the plus side in the A-axis direction) with respect to the sensor element 3. Accordingly, the first circuit 4A and the second circuit 4B are placed on the sides opposite to each other via the sensor element 3, and thereby, the circuits may be placed as far away from each other as possible. Therefore, interferences between the first circuit 4A and the second circuit 4B may be reduced, and noise from the second circuit 4B superimposed on the electric charge Qa (first output signal) or noise from the first circuit 4A superimposed on the electric charge Qb (second output signal) may be effectively suppressed. Thus, tolerance to noise may be improved, and the electric charge Qa may be accurately processed by the first circuit 4A and the electric charge Qb may be accurately processed by the second circuit 4B. As a result, the sensor device 1 that may accurately detect the applied external forces may be obtained.

The first circuit 4A and the second circuit 4B are symmetrically placed with respect to the sensor element 3 in the plan view. Specifically, the first circuit 4A and the second circuit 4B are placed point-symmetrically (rotationally symmetrically by 180°) with respect to the center of the sensor element 3. Thereby, the circuit characteristics (wire lengths, environmental influences, etc.), i.e., charge/voltage conversion characteristics of the first circuit 4A and the second circuit 4B may be made nearly equal to each other. Accordingly, the electric charge Qa according to the external force in the A-axis direction (shear force) and the electric charge Qb according to the external force in the B-axis direction (shear force) may be extracted with balance, and the applied external forces may be detected with higher accuracy.

The wire 46A electrically connecting the first signal side terminal 394 and the resistor 41A of the first circuit 4A and the wire 46B electrically connecting the second signal side terminal 392 and the resistor 41B of the second circuit 4B are placed apart from the connecting portion 26, and thereby, the leak currents generated between the wires 46A, 46B and the seal member 20 may be minimized and the draft characteristics of the sensor device 1 may be improved.

The wires 46A, 46B electrically connecting between the electronic components contained in the respective first circuit 4A and the second circuit 4B are placed apart from the connecting portion 26. That is, the wire 46A electrically connecting the resistor 41A and the capacitor 43A and the wire 46B electrically connecting the resistor 41B and the capacitor 43B are placed apart from the connecting portion 26, and thereby, the leak currents generated between the wires 46A, 46B and the seal member 20 provided on the connecting portion 26 may be minimized and the draft characteristics of the sensor device 1 may be improved.

Second Embodiment

Next, a sensor device according to the second embodiment of the invention will be explained.

Figure 12:
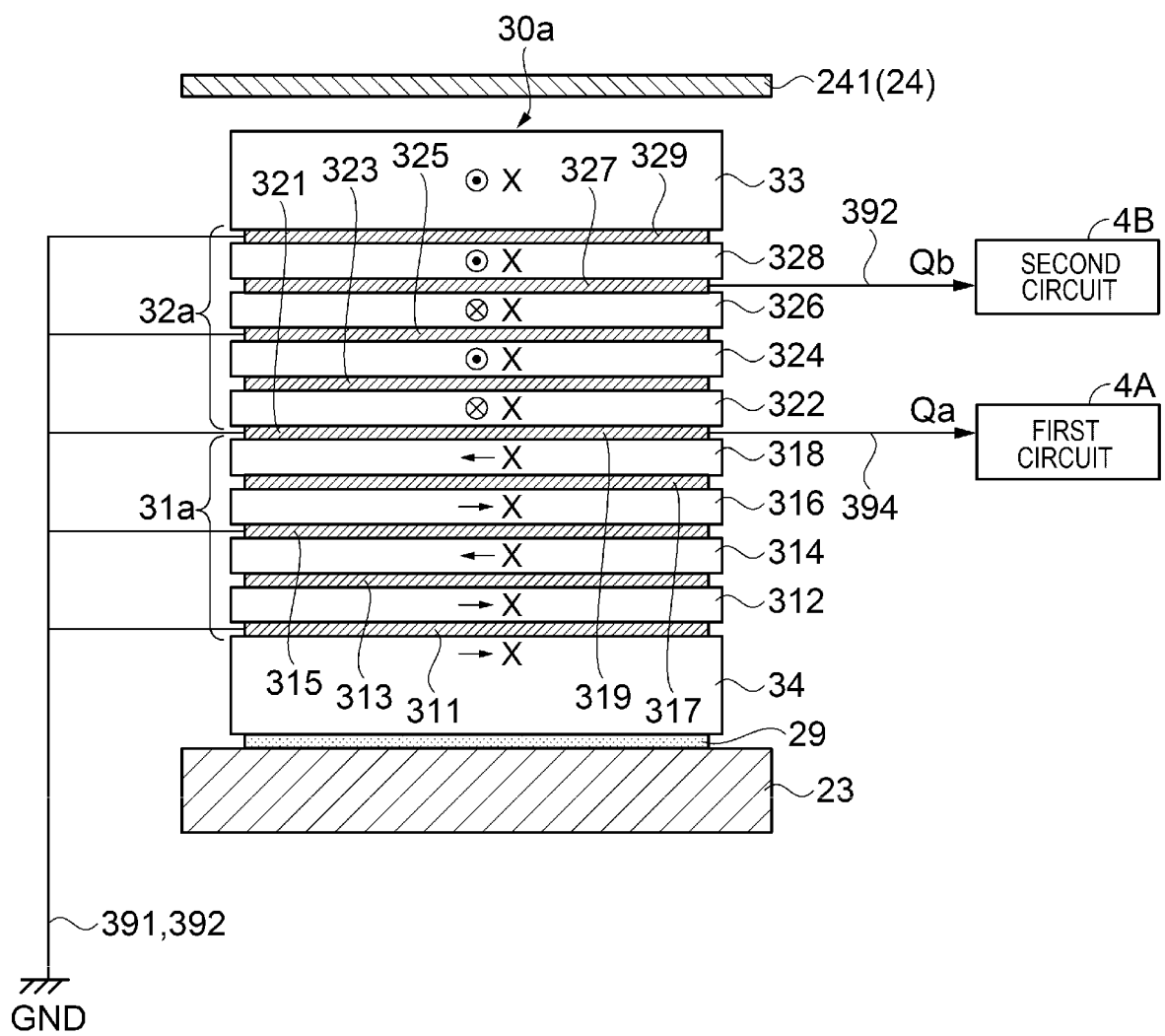
FIG. 12 is a sectional view of a sensor element of a sensor device according to a second embodiment of the invention.

FIG. 12 is a sectional view of a sensor element of the sensor device according to the second embodiment of the invention.

A sensor element 30a of the sensor device according to the embodiment is the same as the sensor element 3 of the sensor device of the above described first embodiment mainly except that the configuration of the sensor element 30a is different. In the following description, the sensor element 30a of the sensor device of the second embodiment will be explained with focus on the differences from the above described first embodiment and the explanation of the same items will be omitted. Further, in FIG. 12, the same configurations as those of the above described first embodiment have the same signs.

As shown in FIG. 12, in the sensor element 30a of the sensor device according to the embodiment, a first piezoelectric element 31a has two sets of the first piezoelectric material 312, the second piezoelectric material 314, and the first signal electrode 313 placed between the first piezoelectric material 312 and the second piezoelectric material 314, and a second piezoelectric element 32a has two sets of the third piezoelectric material 322, the fourth piezoelectric material 324, and the second signal electrode 323 placed between the third piezoelectric material 322 and the fourth piezoelectric material 324.

Specifically, the first piezoelectric element 31a has a configuration in which the first reference potential electrode 311, the first piezoelectric material 312, the first signal electrode 313, the second piezoelectric material 314, the second reference potential electrode 315, a fifth piezoelectric material 316, a third signal electrode 317, a sixth piezoelectric material 318, and a fifth reference potential electrode 319 are stacked sequentially from the downside (the minus side in the C-axis direction).

Further, the second piezoelectric element 32a is stacked on the first piezoelectric element 31a and has a configuration in which the third reference potential electrode 321, the third piezoelectric material 322, the second signal electrode 323, the fourth piezoelectric material 324, the fourth reference potential electrode 325, a seventh piezoelectric material 326, a fourth signal electrode 327, an eighth piezoelectric material 328, and a sixth reference potential electrode 329 are stacked sequentially from the downside (the minus side in the C-axis direction).

The first piezoelectric material 312 and the fifth piezoelectric material 316 have the same polarization direction and the second piezoelectric material 314 and the sixth piezoelectric material 318 have a polarization direction opposite to the first piezoelectric material 312. Further, the third piezoelectric material 322 and the seventh piezoelectric material 326 have the same polarization direction and the fourth piezoelectric material 324 and the eighth piezoelectric material 328 have a polarization direction opposite to the third piezoelectric material 322.

The reference potential electrodes 311, 315, 319 (321), 325, 329 are respectively electrically connected to the ground potential GND via the first reference potential side terminal 391 and the second reference potential side terminal 393. Further, the first signal electrode 313 and the third signal electrode 317 are respectively electrically connected to the first circuit 4A via the first signal side terminal 394, and the second signal electrode 323 and the fourth signal electrode 327 are respectively electrically connected to the second circuit 4B via the second signal side terminal 392.

According to the configuration, the configurations of the first piezoelectric element 31a and the second piezoelectric element 32a may be simpler and the sensor element 30a with higher sensitivity may be obtained.

Note that, in the embodiment, two of the first piezoelectric elements 31 and two of the second piezoelectric elements 32 of the sensor element 3 of the sensor device of the first embodiment are respectively stacked, however, not limited to that. The respective three or more of the first piezoelectric elements 31 and the second piezoelectric elements 32 may be stacked. Thereby, the sensor element with even higher sensitivity may be obtained.

According to the above described second embodiment, the same advantages as those of the above described first embodiment may be offered.

Third Embodiment

Next, a sensor device according to the third embodiment of the invention will be explained.

Figure 13:
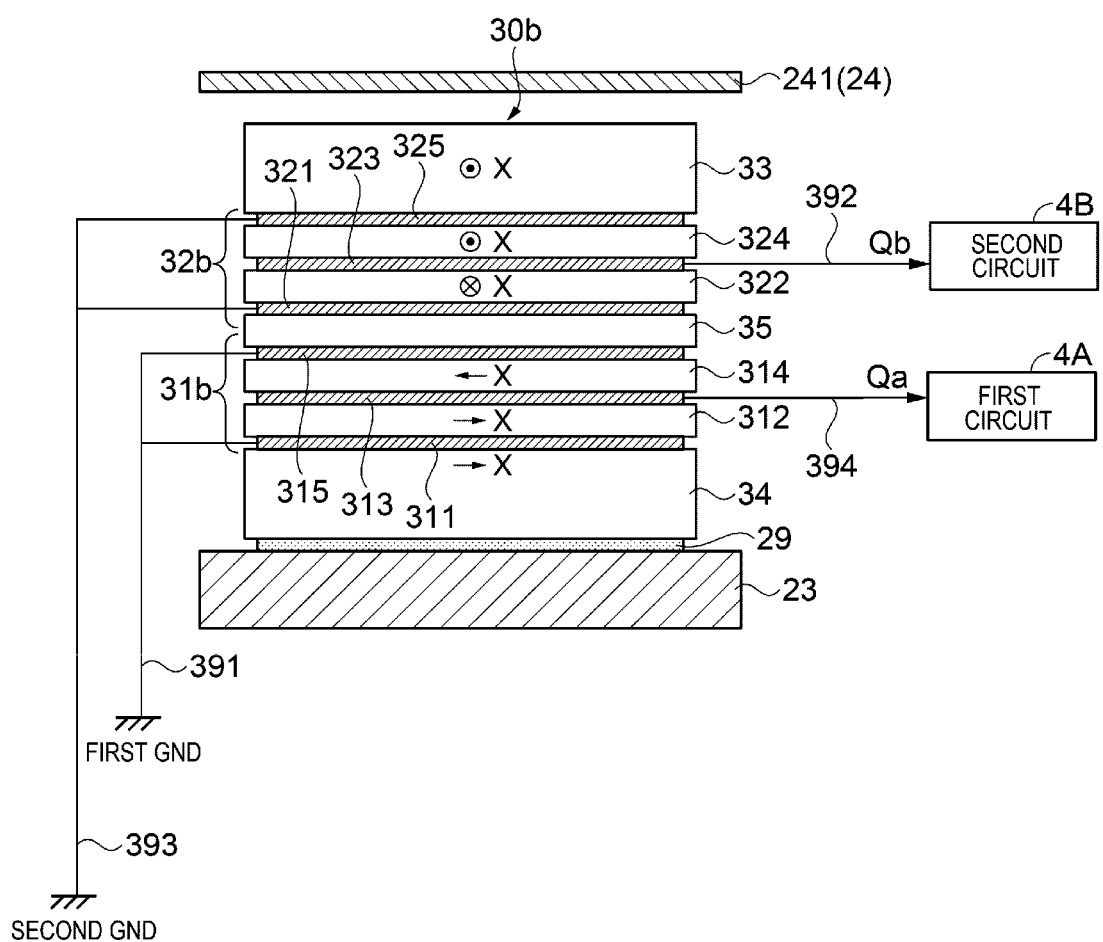
FIG. 13 is a sectional view of a sensor element of a sensor device according to a third embodiment of the invention.

FIG. 13 is a sectional view of a sensor element of the sensor device according to the third embodiment of the invention.

A sensor element 30b of the sensor device according to the embodiment is the same as the sensor element 3 of the sensor device of the above described first embodiment mainly except that the configuration of the sensor element 30b is different. In the following description, the sensor element 30b of the sensor device of the third embodiment will be explained with focus on the differences from the above described first embodiment and the explanation of the same items will be omitted. Further, in FIG. 13, the same configurations as those of the above described first embodiment have the same signs.

As shown in FIG. 13, in the sensor element 30b of the sensor device according to the embodiment, an insulating board 35 is placed between a first piezoelectric element 31b and a second piezoelectric element 32b.

In the first piezoelectric element 31b, the first piezoelectric material 312 is placed between the first reference potential electrode 311 and the first signal electrode 313, and the second piezoelectric material 314 is placed between the second reference potential electrode 315 and the first signal electrode 313. In the second piezoelectric element 32b, the third piezoelectric material 322 is placed between the third reference potential electrode 321 and the second signal electrode 323, and the fourth piezoelectric material 324 is placed between the fourth reference potential electrode 325 and the second signal electrode 323.

Further, the first reference potential side terminal 391 is electrically connected to the first reference potential electrode 311 and the second reference potential electrode 315 and electrically connected to a first ground potential GND, and the second reference potential side terminal 393 is electrically connected to the third reference potential electrode 321 and the fourth reference potential electrode 325 and electrically connected to a second ground potential GND. Accordingly, the first reference potential side terminal 391 and the third reference potential electrode 321 and the fourth reference potential electrode 325 are electrically insulated, and the second reference potential side terminal 393 and the first reference potential electrode 311 and the second reference potential electrode 315 are electrically insulated.

According to the configuration, the first reference potential side terminal 391 and the second reference potential side terminal 393 may be electrically insulated, and crosstalk to the electric charges Qa, Qb (output signals) output from the first signal side terminal 394 and the second signal side terminal 392 and the influence by capacitance coupling between the two signal side terminals may be reduced. Therefore, the sensor element 30b with higher sensitivity may be obtained.

According to the above described third embodiment, the same advantages as those of the above described first embodiment may be offered.

Fourth Embodiment

Next, a sensor device according to the fourth embodiment of the invention will be explained.

Figure 14:
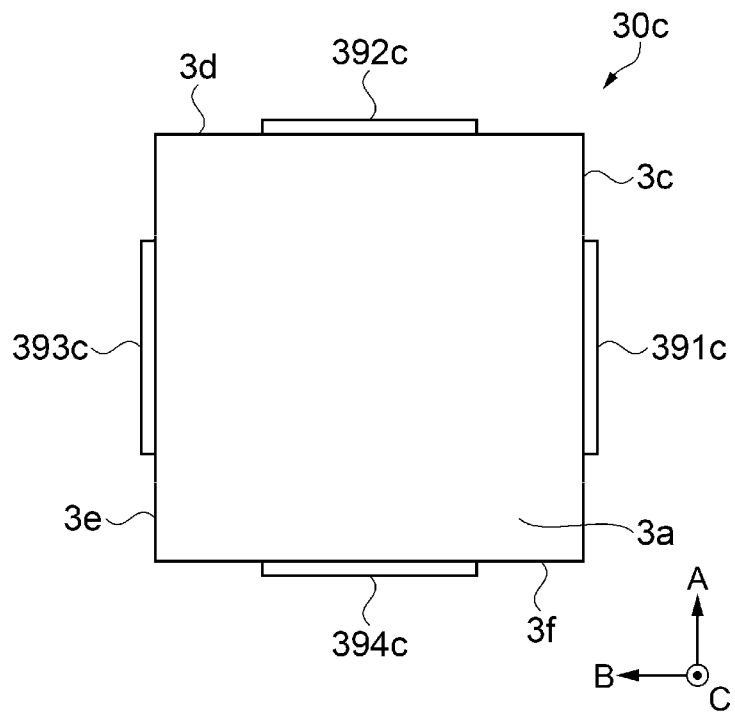
FIG. 14 is a plan view of a sensor element of a sensor device according to a fourth embodiment of the invention.

FIG. 14 is a plan view of a sensor element of the sensor device according to the fourth embodiment of the invention.

A sensor element 30c of the sensor device according to the embodiment is the same as the sensor element 3 of the sensor device of the above described first embodiment mainly except that the configuration of the sensor element 30c is different. In the following description, the sensor element 30c of the sensor device of the fourth embodiment will be explained with focus on the differences from the above described first embodiment and the explanation of the same items will be omitted. Further, in FIG. 14, the same configurations as those of the above described first embodiment have the same signs.

As shown in FIG. 14, in the sensor element 30c of the sensor device according to the embodiment, a first signal side terminal 394c is placed on the side surface 3f and a second signal side terminal 392c is placed on the side surface 3d. Further, a first reference potential side terminal 391c and a second reference potential side terminal 393c are placed on the side surfaces 3c, 3e, respectively, like the first embodiment.

According to the configuration, the first signal side terminal 394c may be placed closer to the first circuit 4A, and the second signal side terminal 392c may be placed closer to the second circuit 4B. Therefore, the length of the wire connecting the first signal side terminal 394c and the resistor 41A may be made even shorter. Similarly, the length of the wire connecting the second signal side terminal 392c and the resistor 41B may be made even shorter. In the wire (46A) connecting the first signal side terminal 394c and the resistor 41A and the wire (46B) connecting the second signal side terminal 392c and the resistor 41B may be made harder to be affected by noise.

Further, the first signal side terminal 394c and the second signal side terminal 392c are placed in the direction in which the first circuit 4A, the sensor element 30c, and the second circuit 4B are arranged (A-axis direction), and thereby, the distance between the sensor element 30c and the connecting portion 26 forming the concave portion 221 of the package 2 may be made shorter in the direction in which the first reference potential side terminal 391c and the second reference potential side terminal 393c are arranged (B-axis direction). Accordingly, the length of the package 2 in the B-axis direction may be made shorter, the package 2 may be downsized, and the sensor device may be downsized.

According to the above described fourth embodiment, the same advantages as those of the above described first embodiment may be offered.

Fifth Embodiment

Next, a sensor device according to the fifth embodiment of the invention will be explained.

Figure 15:
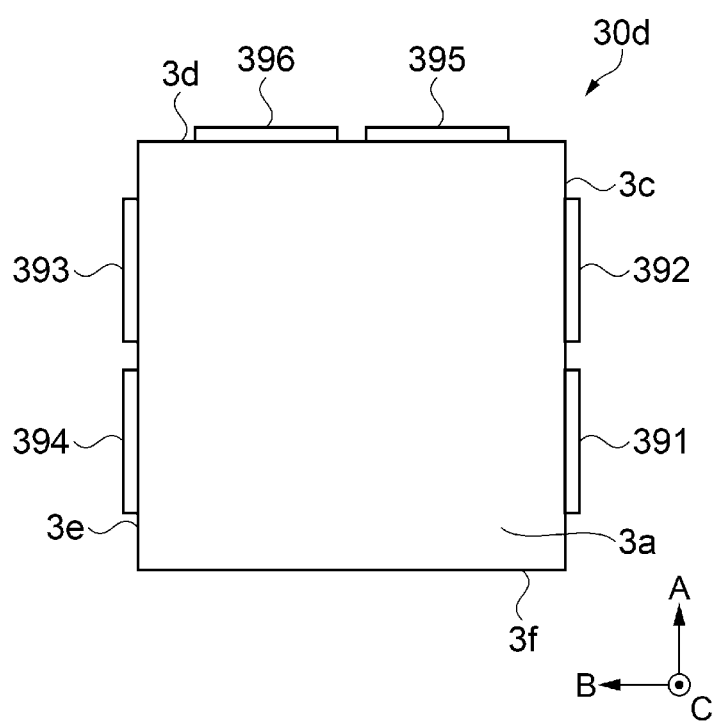
FIG. 15 is a plan view of a sensor element of a sensor device according to a fifth embodiment of the invention.

FIG. 15 is a plan view of a sensor element of the sensor device according to the fifth embodiment of the invention.

A sensor element 30d of the sensor device according to the embodiment is the same as the sensor element 3 of the sensor device of the above described first embodiment mainly except that the configuration of the sensor element 30d is different. In the following description, the sensor element 30d of the sensor device of the fifth embodiment will be explained with focus on the differences from the above described first embodiment and the explanation of the same items will be omitted. Further, in FIG. 15, the same configurations as those of the above described first embodiment have the same signs.

As shown in FIG. 15, in the sensor element 30d of the sensor device according to the embodiment, a third signal side terminal 396 and a third reference potential side terminal 395 are placed on the side surface 3d, and the third reference potential side terminal 395 is placed between the second signal side terminal 392 and the third signal side terminal 396.

The third signal side terminal 396 is electrically connected to a signal electrode of a third piezoelectric element provided within the sensor element 30d and outputting electric charge Qc according to an external force (compression/tensile force) in the C-axis direction. Further, the third reference potential side terminal 395 is electrically connected to a reference potential electrode of the third piezoelectric element, electrically connected to the first reference potential side terminal 391 and the second reference potential side terminal 393, and electrically connected to the ground potential GND.

Note that the first reference potential side terminal 391, the second reference potential side terminal 393, and the third signal side terminal 396 may be electrically insulated.

According to the configuration, regarding the external forces applied to the sensor element 30d, the component in the C-axis direction may be detected in addition to the component in the A-axis direction and the component in the B-axis direction, and the sensor element 30d having the detection axes in the three axis directions may be obtained.

According to the above described fifth embodiment, the same advantages as those of the above described first embodiment may be offered.

Sixth Embodiment

Next, a force detection apparatus according to the sixth embodiment of the invention will be explained.

Figure 16:
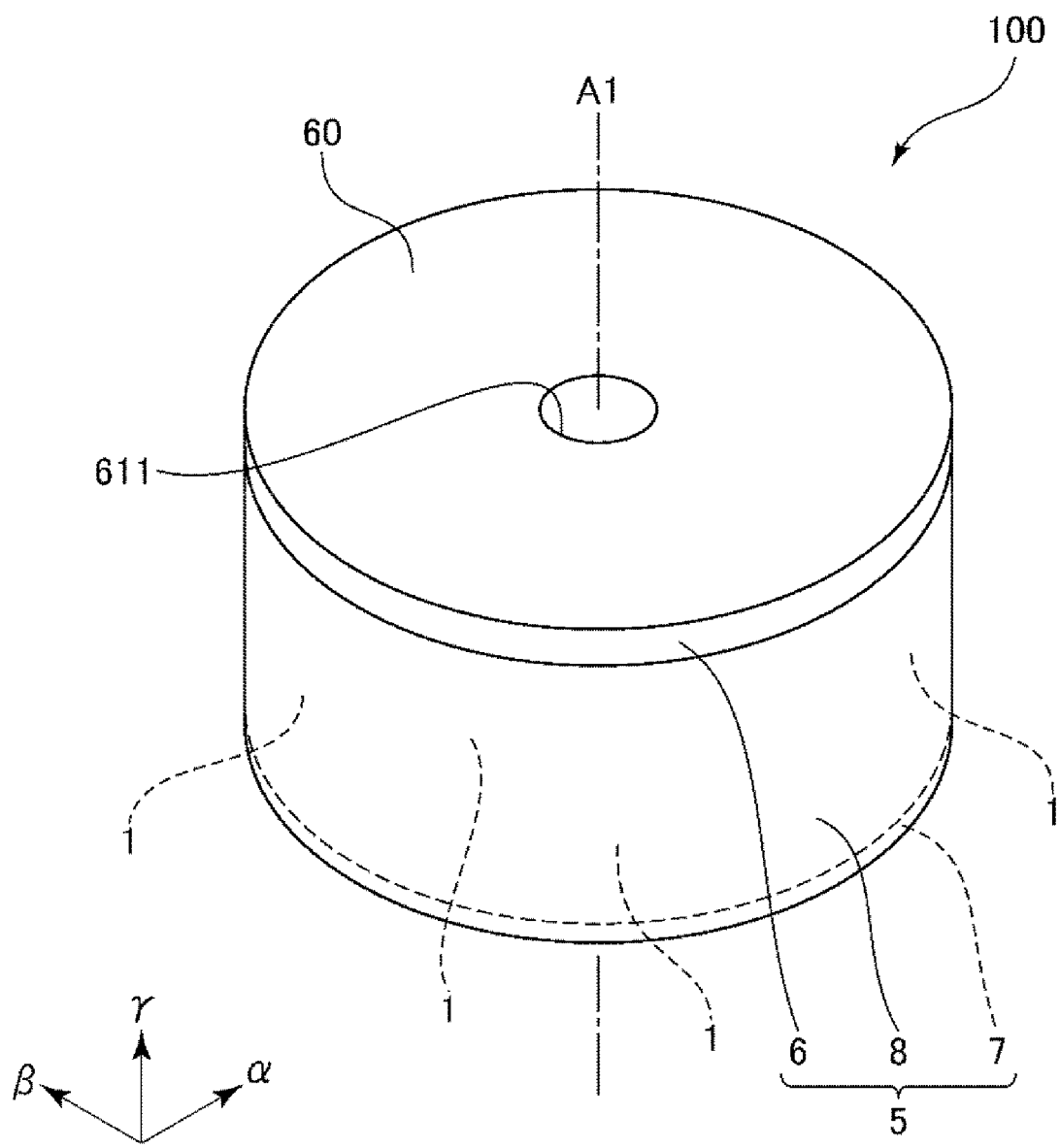
FIG. 16 is a perspective view of a force detection apparatus according to a sixth embodiment of the invention.
Figure 17:
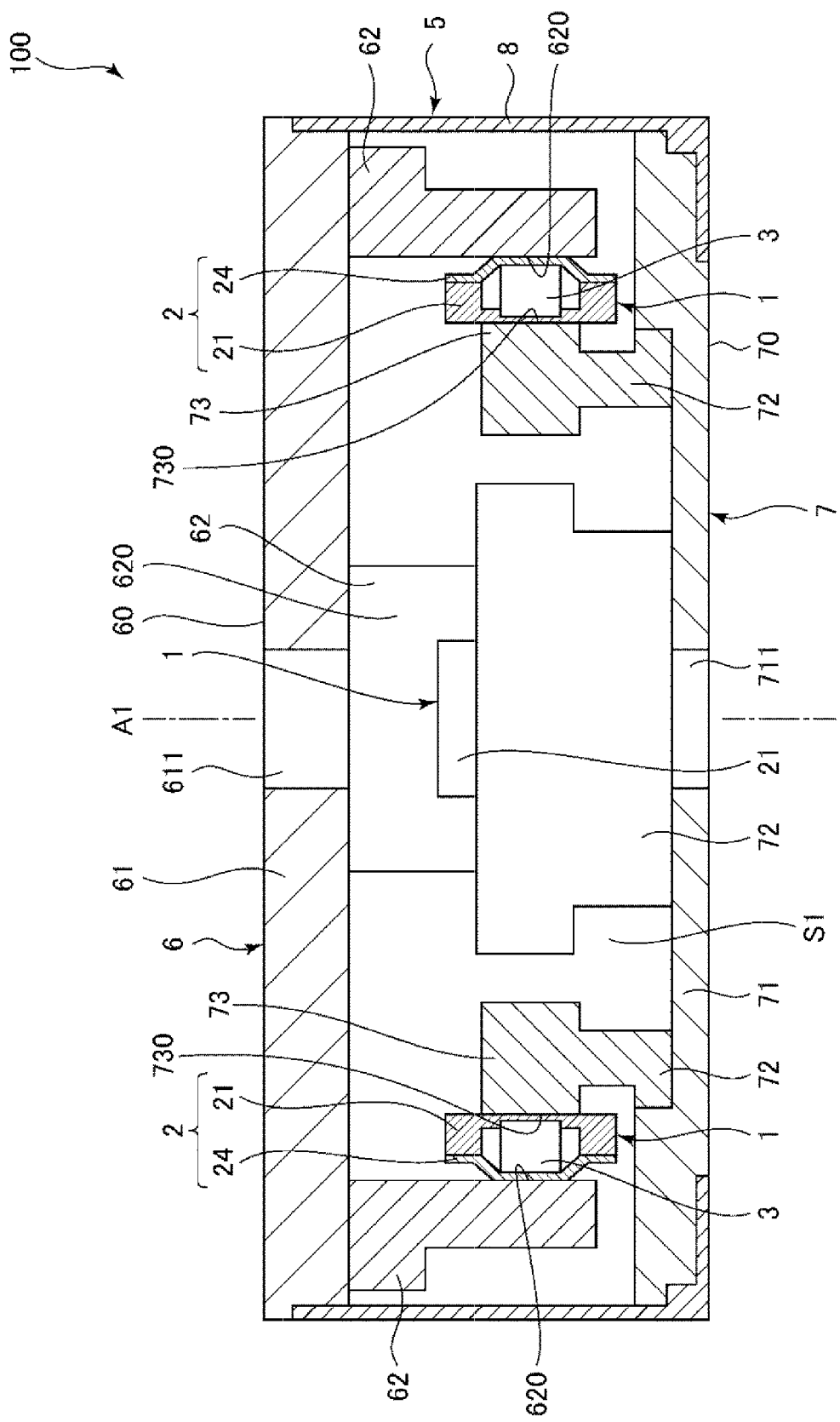
FIG. 17 is a longitudinal sectional view of the force detection apparatus shown in FIG. 16.
Figure 19:
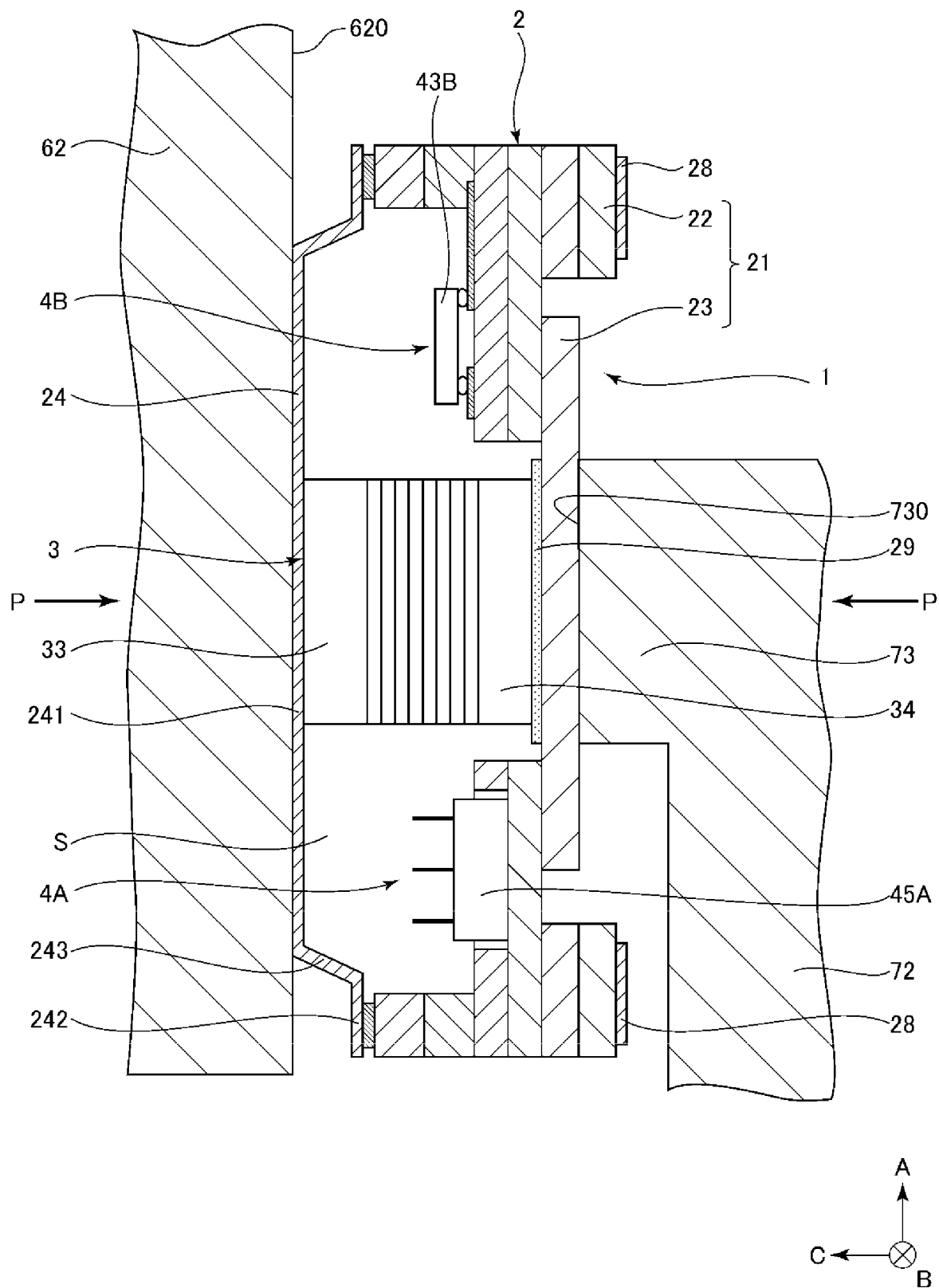
FIG. 19 is a sectional view of a sensor device placed in the force detection apparatus.

FIG. 16 is a perspective view of the force detection apparatus according to the sixth embodiment of the invention. FIG. 17 is a longitudinal sectional view of the force detection apparatus shown in FIG. 16. FIG. 18 is a cross sectional view of the force detection apparatus shown in FIG. 16. FIG. 19 is a sectional view of a sensor device placed in the force detection apparatus.

Hereinafter, for convenience of explanation, three axes orthogonal to one another are referred to as "α-axis", "β-axis, and "γ-axis", and the tip end sides of arrows showing the respective axes are referred to as "plus sides" and the tail end sides are referred to as "minus sides". Further, directions parallel to the α-axis are referred to as "α-axis directions", directions parallel to the β-axis are referred to as "β-axis directions", and directions parallel to the γ-axis are referred to as "γ-axis directions". Furthermore, the plus side in the γ-axis direction is also referred to as "upper" and the minus side in the γ-axis direction is also referred to as "lower". A view as seen from the γ-axis direction is referred to as "plan view".

A force detection apparatus 100 shown in FIG. 16 is a six-axis force sensor that can detect six axis components of an external force applied to the force detection apparatus 100. The six axis components include translational force (shear force) components in the respective directions of the three axes orthogonal to one another (in the drawings, the α-axis, β-axis, and γ-axis) and rotational force (moment) components about the respective three axes.

The force detection apparatus 100 has a plurality (four in the embodiment) of the sensor devices 1 placed at equal intervals (90° intervals) around a center axis A1 (γ-axis) thereof, and a case 5 housing the sensor devices 1. In the force detection apparatus 100, the respective sensor devices 1 output detection signals according to external forces applied to the respective sensor devices 1 and the detection signals are processed, and thereby, the six axis components of the external force applied to the force detection apparatus 100 are detected. As below, the respective parts of the force detection apparatus 100 will be explained.

Case

As shown in FIG. 16, the case 5 has a first case member 6, a second case member 7 placed apart from the first case member 6, and a side wall part 8 provided in the outer peripheral parts of the first case member 6 and the second case member 7.

As shown in FIG. 17, the first case member 6 has a top plate 61 (first base part) and four wall parts 62 (first pressurization parts) provided on the lower surface of the top plate 61 and placed at equal intervals (90° intervals) around the center axis A1. A through hole 611 along the center axis A1 is formed in the center part of the top plate 61. Further, as shown in FIG. 18, a plurality of through holes 621 into which pressurization bolts 50, which will be described later, are inserted are formed in the respective wall parts 62. Inner wall surfaces 620 (inner surfaces) of the respective wall parts 62 are flat surfaces perpendicular to the top plate 61.

As shown in FIG. 17, the second case member 7 has a bottom plate 71 (second base part) and four wall parts 72 (second pressurization parts) provided on the upper surface of the bottom plate 71 and placed at equal intervals (90° intervals) around the center axis A1 to face the above described four wall parts 62. A through hole 711 along the center axis A1 is formed in the center part of the bottom plate 71. Further, the respective wall parts 72 have projecting portions 73 projecting toward the opposed wall parts 62 side, and top surfaces 730 of the projecting portions 73 are parallel to the inner wall surfaces 620 and face the inner wall surfaces 620 at predetermined distances (distances into which the sensor devices 1 can be inserted). As shown in FIG. 18, a plurality of female screw holes 721 with which the tip end portions of the pressurization bolts 50 are screwed together are formed in the respective wall parts 72.

The side wall part 8 has a cylindrical shape and the upper end portion and the lower end portion thereof are fastened to the first case member 6 and the second case member 7 by e.g. screwing, fitting, or the like. Further, the four sensor devices 1 are housed in a space S1 (the inner space of the force detection apparatus 100) surrounded by the side wall part 8, the top plate 61 of the first case member 6, and the bottom plate 71 of the second case member 7.

In the above described case 5, an upper surface 60 of the first case member 6 functions as e.g. an attachment surface to be attached to an end effector 170 (attached member) of a robot 1000, which will be described later, and a lower surface 70 of the second case member 7 functions as e.g. an attachment surface for arm to be attached to an arm 1200 of the robot 1000 to be described later.

The outer shape of the case 5 in the plan view is a circular shape, however, not limited to that. For example, any shape including a polygonal shape such as a triangular shape, quadrangular shape, or pentagonal shape, an elliptical shape, and an odd shape may be employed. In the embodiment, the respective wall parts 62 are formed by the top plate 61 and other members and fastened to the top plate 61, however, may be integrally formed with the top plate 61. Similarly, in the embodiment, the respective wall parts 72 are formed by the bottom plate 71 and other members and fastened to the bottom plate 71, however, may be integrally formed with the bottom plate 71.

The constituent materials of the first case member 6, the second case member 7, and the side wall part 8 are respectively not particularly limited, but e.g. metal materials such as aluminum and stainless steel, ceramics, or the like may be used. Note that the constituent materials of the first case member 6, the second case member 7, and the side wall part 8 may be the same as one another or not.

As shown in FIG. 18, in a plan view, the four sensor devices 1 are placed to be symmetric with respect to a line segment CL passing through the center axis A1 and parallel to the β-axis. Further, as shown in FIG. 17, the respective sensor devices 1 are located between the top plate 61 and the bottom plate 71. Furthermore, the respective sensor devices 1 are located between the wall parts 62 and the wall parts 72 (projecting portions 73) and sandwiched by the wall parts 62 and the wall parts 72 (projecting portions 73). Specifically, as shown in FIG. 19, the respective sensor devices 1 are placed between the wall parts 62 and the wall parts 72 with the base members 21 of the packages 2 facing the wall parts 72 sides and the lid members 24 facing the wall parts 62 sides. In addition, the bottom members 23 of the base members 21 are in contact with the top surfaces 730 of the projecting portions 73 and the center portions 241 of the lid members 24 are in contact with the inner wall surfaces 620 of the wall parts 62.

As shown in FIG. 18, the pressurization bolts 50 couple the wall parts 62 and the wall parts 72, and thereby, the first case member 6 and the second case member 7 are fastened. Further, the pressurization bolts 50 are fastened, and thereby, the sensor devices 1 (sensor elements 3) located between the wall parts 62 and the wall parts 72 are pressurized. That is, under natural conditions, compression forces in directions shown by arrows P in FIG. 19 are applied to the sensor elements 3. In this manner, the sensor elements 3 are pressurized under natural conditions, and thereby, the six axis components of the external force applied to the force detection apparatus 100 may be accurately detected. Note that the fastening forces of the pressurization bolts 50 are appropriately adjusted, and thereby, the pressure applied to the sensor elements 3 may be adjusted.

A pair of the pressurization bolts 50 are provided for each sensor device 1, and the pair of pressurization bolts 50 are located on both sides of the sensor device 1. Note that the placement of the pressurization bolts 50 is not particularly limited. Further, the pressurization bolts 50 may be provided as necessary, but may be omitted if not necessary.

The force detection apparatus 100 has an external force detection circuit (not shown), and the external force detection circuit may detect (calculate) a translational force component Fα in the α-axis direction, a translational force component Fβ in the β-axis direction, a translational force component Fγ in the γ-axis direction, a rotational force component Mα about the α-axis, a rotational force component Mβ about the β-axis, and a rotational force component Mγ about the γ-axis based on the voltages Va, Vb output from the respective sensor devices 1. The external force detection circuit may include e.g. an AD converter and an arithmetic circuit such as a CPU connected to the AD converter.

As above, the force detection apparatus 100 is explained. As described above, the force detection apparatus 100 includes the top plate 61 (first board), the bottom plate 71 (second board), and the sensor devices 1 (the sensor devices according to the invention) provided between the top plate 61 and the bottom plate 71. According to the force detection apparatus 100, the sensor devices 1 are provided, and thereby, the external force may be detected with higher accuracy.

Seventh Embodiment

Next, a robot according to the seventh embodiment of the invention will be explained.

Figure 20:
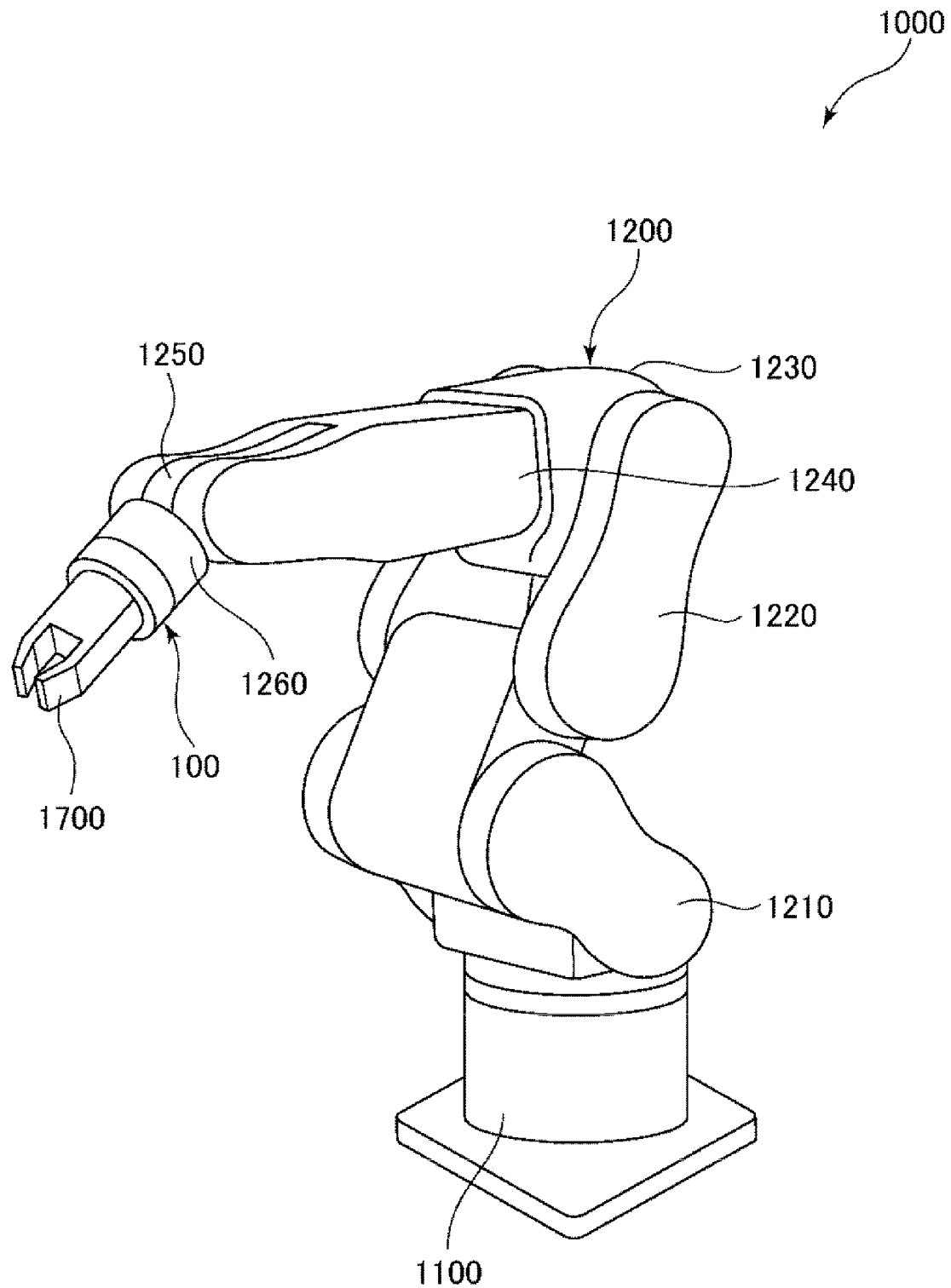
FIG. 20 is a perspective view of a robot according to a seventh embodiment of the invention.

FIG. 20 is a perspective view of the robot according to the seventh embodiment of the invention.

A robot 1000 shown in FIG. 20 may perform work of feeding, removing, carrying, assembly, etc. of objects including precision apparatuses and components forming the apparatuses. The robot 1000 is a single-arm robot, the so-called six-axis vertical articulated robot. The robot 1000 has a base 1100, a robot arm 1200 rotatably coupled to the base 1100, a force detection apparatus 100, and an end effector 1700.

The base 1100 is a part fixed to e.g. a floor, wall, ceiling, movable platform, or the like. The robot arm 1200 has an arm 1210 (first arm), an arm 1220 (second arm), an arm 1230 (third arm), an arm 1240 (fourth arm), an arm 1250 (fifth arm), and an arm 1260 (sixth arm). These arms 1210 to 1260 are sequentially coupled from the proximal end side toward the distal end side. The respective arms 1210 to 1260 are rotatable with respect to the adjacent arms or base 1100.

The force detection apparatus 100 is connected to the distal end of the arm 1260. The force detection apparatus 100 detects forces (including moment) applied to the end effector 1700 attached to the distal end of the force detection apparatus 100. The end effector 1700 is a tool for work on an object as a work object of the robot 1000 and includes a hand having a function of gripping the object. Note that the end effector 1700 is not limited to the hand, but a tool for the details of work or the like of the robot 1000 e.g. a screwing tool for screwing, fitting tool for fitting, or the like may be used.

The robot 1000 has drive units (not shown) including motors that rotate one arm with respect to the other arm (or base 1100). Further, the robot 1000 has angle sensors (not shown) that detect rotation angles of the rotation shafts of the motors.

As above, the robot 1000 is explained. As described above, the robot 1000 includes the base 1100, the robot arm 1200 (arm) connected to the base 1100, and the force detection apparatus 100 (the force detection apparatus according to the invention). According to the robot 1000, the force detection apparatus 100 is provided and, for example, the external force detected by the force detection apparatus 100 is fed back to a control unit (not shown) having a function of controlling the robot 1000, and thereby, work may be executed more precisely. Further, the robot 1000 may sense contact of the end effector 1700 with an obstacle or the like based on the external force detected by the force detection apparatus 100. Accordingly, the robot 1000 may easily perform an obstacle avoidance action, object damage avoidance action, etc., and may execute work more safely.

Note that the force detection apparatus 100 may be provided between the adjacent arms (for example, between the arms 1240, 1250). Or, the robot 1000 may be another robot e.g. a scalar robot, dual-arm robot, or the like. Or, the number of arms of the robot 1000 is six in the embodiment, however, may be one to five, seven, or more.

As above, the sensor elements 3, 30*a*, 30*b*, 30*c*, 30*d*, the sensor device 1, the force detection apparatus 100, and the robot 1000 according to the invention are explained based on the illustrated embodiments, however, the invention is not limited to those. The configurations of the respective parts may be replaced by arbitrary configurations having the same functions. Further, other arbitrary configurations may be added to the invention. Furthermore, the sensor elements 3, 30*a*, 30*b*, 30*c*, 30*d*, the sensor device 1, and the force detection apparatus 100 may be incorporated into another apparatus than the robot 1000 e.g. a vehicle such as an automobile.

As below, the details derived from the embodiments will be described. For example, the sensor elements 3, 30*a*, 30*b*, 30*c*, 30*d* have the following features.

The sensor element includes a stacking structure having surrounding side surfaces in which a plurality of reference potential electrodes, a first piezoelectric element, a first signal electrode placed in a position with the first piezoelectric element between at least one of the plurality of reference potential electrodes and itself and extracting a signal of the first piezoelectric element, a second piezoelectric element, a second signal electrode placed in a position with the second piezoelectric element between at least one of the plurality of reference potential electrodes and itself and extracting a signal of the second piezoelectric element are stacked, a first signal side terminal placed on the side surface and electrically connected to the first signal electrode, a second signal side terminal placed on the side surface and electrically connected to the second signal electrode, a first reference potential side terminal placed on the side surface and electrically connected to at least one of the reference potential electrodes, and a second reference potential side terminal placed on the side surface and electrically connected to at least one of the reference potential electrodes, wherein, in a plan view from a direction of the stacking, the first reference potential side terminal is located between the first signal side terminal and the second signal side terminal on the side surface on one side of a first axis passing through a position of the first signal side terminal and a position of the second signal side terminal, and the second reference potential side terminal is located between the first signal side terminal and the second signal side terminal on the side surface on the other side of the first axis.

Thereby, the first reference potential side terminal and the second reference potential side terminal as reference potentials are placed between the first signal side terminal and the second signal side terminal, and thus, the distance between the two signal side terminals may be made wider, noise generated due to capacitive coupling and electromagnetic coupling between the two signal side terminals may be reduced, and deterioration of electric charges Qa, Qb (output signals) output according to external forces due to noise may be reduced.

In the above described sensor element, it is preferable that the first signal side terminal and the second signal side terminal are placed point-symmetrically with respect to a geometrical center of the sensor element in the plan view, and the first reference potential side terminal and the second reference potential side terminal are placed point-symmetrically with respect to the geometrical center of the sensor element in the plan view.

Thereby, the first signal side terminal and the second signal side terminal are point-symmetrically placed and the first reference potential side terminal and the second reference potential side terminal are point-symmetrically placed, respectively, and thus, detection characteristics of the first piezoelectric element and the second piezoelectric element may be made nearly equal to each other. Further, the electric charge Qa (first output signal) according to the external force in the A-axis direction (shear force) and the electric charge Qb (second output signal) according to the external force in the B-axis direction (shear force) may be extracted with balance, and the applied external forces may be detected with higher accuracy and output from the first signal side terminal and the second signal side terminal.

In the above described sensor element, it is preferable that the first piezoelectric element has a first piezoelectric material and a second piezoelectric material having a polarization direction opposite to a polarization direction of the first piezoelectric material, the first signal electrode is placed between the first piezoelectric material and the second piezoelectric material, the first piezoelectric material, the first signal electrode, the second piezoelectric material are placed between two of the plurality of reference potential electrodes, and the second piezoelectric element has a third piezoelectric material and a fourth piezoelectric material having a polarization direction opposite to a polarization direction of the third piezoelectric material, the second signal electrode is placed between the third piezoelectric material and the fourth piezoelectric material, and the third piezoelectric material, the second signal electrode, and the fourth piezoelectric material are placed between two of the plurality of reference potential electrodes.

Thereby, the configurations of the first piezoelectric element and the second piezoelectric element are simpler, and the sensor element with high sensitivity may be obtained.

In the above described sensor element, it is preferable that the first piezoelectric element has a plurality of sets of the first piezoelectric material, the second piezoelectric material, and the first signal electrode placed between the first piezoelectric material and the second piezoelectric material, and the second piezoelectric element has a plurality of sets of the third piezoelectric material, the fourth piezoelectric material, and the second signal electrode placed between the third piezoelectric material and the fourth piezoelectric material.

Thereby, the sensor element with higher sensitivity may be obtained by the simple configuration of a combination of a plurality of the first piezoelectric elements and a plurality of the second piezoelectric elements.

In the above described sensor element, it is preferable that the plurality of reference potential electrodes include a first reference potential electrode, a second reference potential electrode, a third reference potential electrode, and a fourth reference potential electrode, the first piezoelectric material is placed between the first reference potential electrode and the first signal electrode, the second piezoelectric material is placed between the second reference potential electrode and the first signal electrode, the third piezoelectric material is placed between the third reference potential electrode and the second signal electrode, the fourth piezoelectric material is placed between the fourth reference potential electrode and the second signal electrode, the first reference potential side terminal is electrically connected to the first reference potential electrode and the second reference potential electrode, the second reference potential side terminal is electrically connected to the third reference potential electrode and the fourth reference potential electrode, the first reference potential side terminal and the third reference potential electrode and the fourth reference potential electrode are electrically insulated, and the second reference potential side terminal and the first reference potential electrode and the second reference potential electrode are electrically insulated.

Thereby, the first reference potential side terminal and the second reference potential side terminal may be electrically insulated, and crosstalk to the electric charges Qa, Qb (output signals) output from the first signal side terminal and the second signal side terminal and the influence by capacitance coupling between the two signal side terminals may be reduced. Therefore, the sensor element with higher sensitivity may be obtained.

In the above described sensor element, it is preferable that the first piezoelectric material, the second piezoelectric material, the third piezoelectric material, and the fourth piezoelectric material are quartz crystal.

Thereby, the configurations of the first piezoelectric element and the second piezoelectric element are simpler, and the sensor element having good properties including higher sensitivity, wider dynamic range, and higher rigidity may be obtained.

For example, the sensor device 1 has the following features.

The sensor device includes the above described sensor element, a base member in which the sensor element is placed, a lid member connected to the base member and forming a housing space for housing the sensor element with the base member, a first circuit containing an electronic component placed on the base member within the housing space and electrically connected to a first signal side terminal and a first reference potential side terminal, and a second circuit containing an electronic component placed on the base member within the housing space and electrically connected to a second signal side terminal and a second reference potential side terminal, wherein the first circuit is placed on one side of the sensor element and the second circuit is placed on the other side of the sensor element in a plan view of the base member.

Thereby, the first circuit and the second circuit may be placed apart with the sensor element in between. Accordingly, interferences between the first circuit and the second circuit may be reduced, and noise from the second circuit superimposed on a first signal or noise from the first circuit superimposed on a second signal may be effectively suppressed. Thus, the first signal may be accurately processed by the first circuit and the second signal may be accurately processed by the second circuit. As a result, the sensor device that may accurately detect the applied external force and exhibit good force detection characteristics may be obtained.

In the above described sensor device, it is preferable that, in the sensor element, the first signal side terminal and the second signal side terminal are placed point-symmetrically with respect to a geometrical center of the sensor element in the plan view, the first reference potential side terminal and the second reference potential side terminal are placed point-symmetrically with respect to the geometrical center, and the first circuit and the second circuit are placed point-symmetrically with respect to the geometrical center.

Thereby, the first circuit and the second circuit are placed point-symmetrically with respect to the sensor element, and the circuit characteristics (wire lengths, environmental influences, etc.), i.e., charge/voltage conversion characteristics of the first circuit and the second circuit may be made nearly equal to each other. Accordingly, the electric charge Qa according to the external force in the A-axis direction (shear force) and the electric charge Qb according to the external force in the B-axis direction (shear force) may be extracted with balance, and the applied external forces may be detected with higher accuracy.

In the above described sensor device, it is preferable that the lid member is connected to the base member having a connecting portion, a wire connecting the first signal side terminal and the electronic component of the first circuit is placed apart from the connecting portion, and a wire connecting the second signal side terminal and the electronic component of the second circuit is placed apart from the connecting portion.

Thereby, a leak current generated between the wire connecting the first signal side terminal and the electronic component of the first circuit and the wire connecting the second signal side terminal and the electronic component of the second circuit and a seal member provided in the connecting portion may be minimized and draft characteristics of the sensor device may be improved.

In the above described sensor device, it is preferable that the first circuit includes a plurality of the electronic components, the second circuit includes a plurality of the electronic components, and wires connecting between the electronic components contained in the respective first circuit and second circuit are placed apart from the connecting portion.

Thereby, a leak current generated between the wires connecting between the electronic components contained in the respective first circuit and second circuit and the seal member provided in the connecting portion may be minimized and draft characteristics of the sensor device may be improved.

For example, the force detection apparatus 100 has the following features.

The force detection apparatus includes a first board, a second board, and the above described sensor device placed between the first board and the second board.

According to the force detection apparatus, the above described sensor device is provided and the external forces may be detected with higher accuracy.

For example, the robot 1000 has the following features.

The robot includes a base, an arm connected to the base, and the above described force detection apparatus.

According to the robot, the above described force detection apparatus is provided and more precise work may be executed.

The entire disclosure of Japanese Patent Application No. 2018-061415, filed Mar. 28, 2018, is expressly incorporated by reference herein.

What is claimed is:

1. A sensor element comprising:
    a stacking structure having surrounding side surfaces in which
    a plurality of reference potential electrodes,
    a first piezoelectric element,
    a first signal electrode placed in a position with the first piezoelectric element between at least one of the plurality of reference potential electrodes and itself and extracting a signal of the first piezoelectric element,
    a second piezoelectric element,
    a second signal electrode placed in a position with the second piezoelectric element between at least one of the plurality of reference potential electrodes and itself and extracting a signal of the second piezoelectric element are stacked;
    a first signal side terminal placed on the side surface and electrically connected to the first signal electrode;
    a second signal side terminal placed on the side surface and electrically connected to the second signal electrode;
    a first reference potential side terminal placed on the side surface and electrically connected to at least one of the reference potential electrodes; and
    a second reference potential side terminal placed on the side surface and electrically connected to at least one of the reference potential electrodes,
    wherein the first reference potential side terminal is located between the first signal side terminal and the second signal side terminal along a first axis passing through the first signal side terminal and the second signal side terminal in a plan view from a direction of the stacking,
    the second reference potential side terminal is located between the first signal side terminal and the second signal side terminal along the first axis,
    the first axis is located between the first reference potential side terminal and the second reference potential side terminal in the plain view from the direction of the stacking,
    the first piezoelectric element has a first piezoelectric material and a second piezoelectric material having a polarization direction opposite to a polarization direction of the first piezoelectric material,
    the first signal electrode is placed between the first piezoelectric material and the second piezoelectric material,
    the first piezoelectric material, the first signal electrode, the second piezoelectric material are placed between two of the plurality of reference potential electrodes,
    the second piezoelectric element has a third piezoelectric material and a fourth piezoelectric material having a polarization direction opposite to a polarization direction of the third piezoelectric material,
    the second signal electrode is placed between the third piezoelectric material and the fourth piezoelectric material, and
    the third piezoelectric material, the second signal electrode, and the fourth piezoelectric material are placed between two of the plurality of reference potential electrodes.

2. The sensor element according to claim 1, wherein the first signal side terminal and the second signal side terminal are placed point-symmetrically with respect to a geometrical center of the sensor element in the plan view from the direction of the stacking, and
    the first reference potential side terminal and the second reference potential side terminal are placed point-symmetrically with respect to the geometrical center of the sensor element in the plan view from the direction of the stacking.

3. The sensor element according to claim 1, wherein the first piezoelectric element has a plurality of sets of the first piezoelectric material, the second piezoelectric material, and the first signal electrode placed between the first piezoelectric material and the second piezoelectric material, and
    the second piezoelectric element has a plurality of sets of the third piezoelectric material, the fourth piezoelectric material, and the second signal electrode placed between the third piezoelectric material and the fourth piezoelectric material.

4. The sensor element according to claim 1, wherein the plurality of reference potential electrodes include:
a first reference potential electrode;
a second reference potential electrode;
a third reference potential electrode; and
a fourth reference potential electrode,
the first piezoelectric material is placed between the first reference potential electrode and the first signal electrode,
the second piezoelectric material is placed between the second reference potential electrode and the first signal electrode,
the third piezoelectric material is placed between the third reference potential electrode and the second signal electrode,
the fourth piezoelectric material is placed between the fourth reference potential electrode and the second signal electrode,
the first reference potential side terminal is electrically connected to the first reference potential electrode and the second reference potential electrode,
the second reference potential side terminal is electrically connected to the third reference potential electrode and the fourth reference potential electrode,
the first reference potential side terminal and the third reference potential electrode and fourth reference potential electrode are electrically insulated, and
the second reference potential side terminal and the first reference potential electrode and second reference potential electrode are electrically insulated.

5. The sensor element according to claim 1, wherein the first piezoelectric material, the second piezoelectric material, the third piezoelectric material, and the fourth piezoelectric material are quartz crystal.

6. A sensor device comprising:
a sensor element including
a stacking structure having surrounding side surfaces in which
a plurality of reference potential electrodes,
a first piezoelectric element,
a first signal electrode placed in a position with the first piezoelectric element between at least one of the plurality of reference potential electrodes and itself and extracting a signal of the first piezoelectric element,
a second piezoelectric element,
a second signal electrode placed in a position with the second piezoelectric element between at least one of the plurality of reference potential electrodes and itself and extracting a signal of the second piezoelectric element are stacked,
a first signal side terminal placed on the side surface and electrically connected to the first signal electrode,
a second signal side terminal placed on the side surface and electrically connected to the second signal electrode,
a first reference potential side terminal placed on the side surface and electrically connected to at least one of the reference potential electrodes, and
a second reference potential side terminal placed on the side surface and electrically connected to at least one of the reference potential electrodes;
a base in which the sensor element is placed; and
a lid connected to the base, wherein
the first reference potential side terminal is located between the first signal side terminal and the second signal side terminal along a first axis passing through the first signal side terminal and the second signal side terminal in a plan view from a direction of the stacking,
the second reference potential side terminal is located between the first signal side terminal and the second signal side terminal along the first axis, and
the first axis is located between the first reference potential side terminal and the second reference potential side terminal in the plain view from the direction of the stacking,
and further comprising:
a first circuit containing an electronic component placed on the base within a housing space formed the base and the lid for housing the sensor element and electrically connected to a first signal side terminal and a first reference potential side terminal; and
a second circuit containing an electronic component placed on the base within the housing space and electrically connected to a second signal side terminal and a second reference potential side terminal,
wherein the sensor element is placed between the first circuit and the second circuit in a plan view of the base.

7. The sensor device according to claim 6, wherein the first signal side terminal and the second signal side terminal are placed point-symmetrically with respect to a geometrical center of the sensor element in the plan view from the direction of the stacking, and
the first reference potential side terminal and the second reference potential side terminal are placed point-symmetrically with respect to the geometrical center of the sensor element in the plan view from the direction of the stacking.

8. The sensor device according to claim 6, wherein, in the sensor element,
the first reference potential side terminal and the second reference potential side terminal are placed point-symmetrically with respect to the geometrical center, and
the first circuit and the second circuit are placed point-symmetrically with respect to the geometrical center.

9. A force detection apparatus comprising:
a first board,
a second board; and
a sensor device placed between the first board and the second board and including
a sensor element,
a base in which the sensor element is placed, and
a lid connected to the base,
wherein the sensor device includes
a stacking structure having surrounding side surfaces in which
a plurality of reference potential electrodes,
a first piezoelectric element,
a first signal electrode placed in a position with the first piezoelectric element between at least one of the plurality of reference potential electrodes and itself and extracting a signal of the first piezoelectric element,
a second piezoelectric element, and
a second signal electrode placed in a position with the second piezoelectric element between at least one of the plurality of reference potential electrodes and itself and extracting a signal of the second piezoelectric element are stacked, a first signal side terminal placed on the side surface and electrically connected to the first signal electrode, a second signal side terminal placed on the side surface and electrically connected to the second signal electrode, a first reference potential side terminal placed on the side surface and electrically connected to at least one of the reference potential electrodes, and a second reference potential side terminal placed on the side surface and electrically connected to at least one of the reference potential electrodes, and the first reference potential side terminal is located between the first signal side terminal and the second signal side terminal along a first axis passing through the first signal side terminal and the second signal side terminal in a plan view from a direction of the stacking, the second reference potential side terminal is located between the first signal side terminal and the second signal side terminal along the first axis, and the first axis is located between the first reference potential side terminal and the second reference potential side terminal in the plain view from the direction of the stacking.

* * * * *